(12) United States Patent
Joo et al.

(10) Patent No.: US 8,716,112 B2
(45) Date of Patent: May 6, 2014

(54) METHOD FOR CRYSTALLIZING AMORPHOUS SILICON THIN FILM AND METHOD FOR FABRICATING POLY CRYSTALLINE THIN FILM TRANSISTOR USING THE SAME

(71) Applicants: Seung Ki Joo, Seongnam-si (KR); Chang Woo Byun, Seoul (KR); Se Wan Son, Yongin-si (KR); Yong Woo Lee, Seoul (KR); Hyun Mo Kang, Incheon (KR); Seol Ah Park, Seoul (KR); Woo Chang Lim, Seoul (KR); Tao Li, Seoul (KR); Seung Jae Yun, Seoul (KR); Sang Joo Lee, Seoul (KR)

(72) Inventors: Seung Ki Joo, Seongnam-si (KR); Chang Woo Byun, Seoul (KR); Se Wan Son, Yongin-si (KR); Yong Woo Lee, Seoul (KR); Hyun Mo Kang, Incheon (KR); Seol Ah Park, Seoul (KR); Woo Chang Lim, Seoul (KR); Tao Li, Seoul (KR); Seung Jae Yun, Seoul (KR); Sang Joo Lee, Seoul (KR)

(73) Assignee: Seung Ki Joo (KR)

( * ) Notice: Subject to any disclaimer, the term of this patent is extended or adjusted under 35 U.S.C. 154(b) by 0 days.

(21) Appl. No.: 13/630,148

(22) Filed: Oct. 16, 2012

(65) Prior Publication Data
US 2013/0273724 A1    Oct. 17, 2013

(30) Foreign Application Priority Data

Apr. 12, 2012   (KR) .................. 10-2012-0038103
Apr. 16, 2012   (KR) .................. 10-2012-0039068
May 10, 2012   (KR) .................. 10-2012-0049877

(51) Int. Cl.
*H01L 21/20*   (2006.01)

(52) U.S. Cl.
USPC ....................................................... 438/486

(58) Field of Classification Search
USPC ................................. 438/482, 486
See application file for complete search history.

(56) References Cited

U.S. PATENT DOCUMENTS

2011/0223748 A1*   9/2011   Jang et al. .................. 438/487

FOREIGN PATENT DOCUMENTS

KR   1020050113035   12/2005
KR   1020060121475   11/2006

OTHER PUBLICATIONS

Byun, et al., Improvement of Electrical Performance of Metal-Induced Laterally Crystallized Polycrystalline Silicon Thin-Film Transistors, Journal of The Electrochemical Society, 2012, p. 115-121.
Byun, et al., High Performance Poly-Si Thin Film Transistors Fabricated by Self-Aligned Seed Induced Lateral Crystallization, Electronic Materials Letters, 2011, vol. 7, p. 298-302.
Byun, et al., High Performance Poly-Si Thin Film Transistors Fabricated by Novel and Simple Crystallization Method Using Ni-Silicide Seeds, Journal of The Electrochemical Society, 2011, p. 354-358.

* cited by examiner

*Primary Examiner* — Bradley K Smith
(74) *Attorney, Agent, or Firm* — Cantor Colburn LLP

(57) ABSTRACT

Provided is a method of crystallizing an amorphous silicon thin film transistor and a method of fabricating a polycrystalline thin film transistor using the same, in which the polycrystalline thin film transistor indicating leakage current characteristics of a level that is applicable for active matrix organic light emitting diode displays (AMOLEDs) can be manufactured by using a silicide seed induced lateral crystallization (SILC) method. The amorphous silicon thin film transistor crystallizing method includes the steps of: forming an amorphous silicon layer on a substrate; forming an active region by patterning the amorphous silicon layer; forming a crystallization induced metal layer in both a source region and a drain region that are placed on both side ends of the active region; forming a number of dot-shaped metal silicide seeds on the surfaces of the source region and the drain region made of amorphous silicon by removing the crystallization induced metal layer; and crystallizing the active region formed of the amorphous silicon layer by heat-treating the substrate by using the metal silicide seeds as crystallization seeds.

18 Claims, 22 Drawing Sheets

MILC

MILC

SILC

METHOD FOR CRYSTALLIZING AMORPHOUS SILICON THIN FILM AND METHOD FOR FABRICATING POLY CRYSTALLINE THIN FILM TRANSISTOR USING THE SAME

BACKGROUND OF THE INVENTION

1. Field of the Invention

The present invention relates to a method of crystallizing an amorphous silicon thin film transistor and a method of fabricating a polycrystalline thin film transistor using the same. More particularly, the present invention relates to a method of crystallizing an amorphous silicon thin film transistor by using a metal silicide seed induced crystallization (SIC) process that can crystallize an amorphous silicon thin film without metal contamination by using dot-shaped metal silicide seeds as crystallization heat-treatment nuclei during performing a crystallization heat-treatment process, and a method of fabricating a polycrystalline thin film transistor using the same.

2. Description of the Related Art

Thin film transistors (TFTs) are used to select pixels in display devices, such as liquid crystal displays (LCDs) or active matrix organic light emitting diode displays (AMOLEDs), in which each of the thin film transistors (TFTs) is ordinarily formed by depositing amorphous silicon on a transparent substrate such as glass or quartz, forming a gate and a gate electrode, injecting impurities into a source region and drain region to then perform an annealing treatment and activating the source and drain regions to then form an insulating layer.

Active layers that form a source region, a drain region, and a channel region of a thin film transistor are ordinarily formed by depositing amorphous silicon on a transparent substrate such as glass by using a chemical vapor deposition (CVD) method.

However, an amorphous silicon layer that is directly deposited on the substrate by such a chemical vapor deposition (CVD) method, has a low electron mobility. The display devices using thin film transistors require a fast operation speed and are miniaturized. Accordingly, an integration of driving integrated circuits (ICs) becomes large and an aperture ratio of pixel areas is reduced. Therefore, there is a need to increase an electron mobility of silicon films, and thus form a drive circuit together with a pixel thin film transistor (TFT), and increase an aperture ratio of individual pixels.

In addition, the current display market has a trend that is changing from LCDs to AMOLEDs. The AMOLED display devices need switching transistors that can operate at high speed in order to select and drive pixels at high speed. These high-speed switching transistors may be implemented by using polycrystalline silicon thin film transistors with a high electron mobility.

Therefore, polycrystalline silicon thin film transistors with the high electron mobility are essential elements in the AMOLED display devices. For this, methods of crystallizing the amorphous silicon thin film transistors are needed. There are a solid phase crystallization method, an excimer laser crystallization method using excimer laser, a metal-induced crystallization method, etc., as the well-known current crystallization methods.

First, the solid phase crystallization (SPC) method is a method of annealing amorphous silicon layers at temperatures of about 600° C. or less that is a temperature at which glass that forms a substrate is deformed, over several hours to several tens of hours. The SPC method requires a heat-treatment process for long periods of time, so the productivity is low. In addition, when an area of the substrate is large, there is a problem that, the substrate may be deformed during the heat-treatment process for a long time even at temperatures of about 600° C. or less The excimer laser crystallization (ELC) method is a method of instantaneously crystallizing amorphous silicon layers by injecting excimer laser onto the amorphous silicon layers to thus cause a high temperature locally to happen for a very short period. The ELC method has the technical difficulties in precisely controlling injection of the laser light, and allows only one substrate to be processed at a time. Accordingly, there is a problem that the productivity is lower than a case of batch-processing several substrates simultaneously in a furnace.

In order to overcome the disadvantages of the conventional crystallization methods of crystallizing the amorphous silicon layers, a phenomenon that a phase change is induced from amorphous silicon to crystalline silicon at low temperatures in the case that a metal such as nickel, gold, and aluminum is made to be in contact with amorphous silicon, or the metal is injected into silicon, has been used. Such a phenomenon is called crystallization induced metal (MIC). When thin film transistors are fabricated by using the MIC phenomena, metals remain in the crystalline silicon that forms active layers of the thin film transistors. In particular, there is a problem that current leakage may be caused in the channel regions of the thin film transistors.

In recent years, instead of causing meals to directly induce the phase change of the silicon as in the MIC method, methods of crystallizing silicon layers using a metal induced lateral crystallization (MILC) phenomenon in which silicides generated by reaction of metal and silicon continue to propagate laterally and to sequentially induce crystallization of amorphous silicon, have been proposed (S. W. Lee & S. K. Joo, IEEE Electron Device Letter, 17(4), p. 160, 1996).

In particular, metals such as nickel and palladium are known as metals causing the MILC phenomenon to occur. In the case of crystallizing amorphous silicon layers by using the MILC phenomenon, a silicide interface including metals moves laterally as the phase change of the amorphous silicon is propagated. Accordingly, metal components used to induce crystallization do not almost remain in the poly crystalline silicon layer crystallized by the MILC phenomenon. As a result, the crystallization method using the MILC phenomenon does not greatly influence upon the characteristics of the current leakage and the other behaviors of the transistors having the active layers formed of the polycrystalline silicon layers. In addition, in the case of using the MILC phenomenon, crystallization of silicon may be induced at a relatively low temperature of 550° C. or less, to thereby provide an advantage that several substrates may be crystallized simultaneously without any damage of the substrates by using a furnace.

The conventional crystallization methods using the MILC phenomenon perform MIC/MILC crystallization through a heat-treatment process after having deposited crystallization induced metals in a source/drain region, and thus has a problem that electrical properties fall due to high metal contamination of a channel region by a continuous inflow of a catalytic metal during performing a crystallization heat-treatment process.

Moreover, the MILC method may cause the remaining metals that are not deposited in the source/drain region and do not act as a crystallization catalyst to be likely to be oxidized after being heat-treated, and thus may have the difficulties that the remaining metals may not be completely removed even in the process of removing the remaining metals.

In addition, there is a big limitation in order to commercialize the MILC technology, in other words, in the case of forming a gate insulating layer and a gate electrode on an active layer area, after having processed crystallization for the active layer area made of amorphous silicon in advance, a glass substrate may be shrunk during performing the crystallization heat-treatment process, to thereby cause a problem that it is difficult to perform a subsequent gate and wiring formation process. In order to overcome these problems, the conventional technology performs a process of compressing a glass substrate as a first process. However, the compression process of the glass substrate may be applied in a small-size display, but may not be applied in a large-area substrate because of deformation of the glass substrate. As a result, the above-described conventional technologies do not cause any problem to occur in the manufacture of small-size AMOLEDs, but may cause problems that it is difficult to be applied in the manufacture of large-area AMOLEDs.

Meanwhile, there are two reasons that the currently developed MILC technologies may not be applied to the AMOLEDs.

The first reason is the leakage current. Light-emitting organic materials may respond to even a very low current to emit light in the AMOLEDs. Thus, it is required to lower the leakage current in the AMOLEDs as low as possible. However, TFTs produced by the conventional MILC technologies show a leakage current of $1\times10^{-10}$ Amp or higher.

The second reason is uniformity of electrical characteristics that occur because a lot of crystallization induced metals are trapped in a channel region. When a drain voltage is increased in the MILC process, the leakage current increases because of a lot of the trapped metals. In the case that a crystallization induced metal such as Ni is trapped in the polycrystalline silicon, a leakage current is induced by forming a trap level, in a silicon band gap. That is, as the drain voltage becomes high, a leakage current is generated from a trap state that, exists deep in the band gap.

A conventional method of crystallizing an amorphous semiconductor thin film is disclosed in Korean Patent Registration No. 10-0653853 (28 Nov. 2006).

The conventional amorphous semiconductor thin film crystallization method disclosed in the Korean Patent Registration No. 10-0653853, includes the steps of: forming a pair of non-metallic seeds at a predetermined distance from each other on a transparent insulating substrate in order to induce crystallization of the amorphous semiconductor thin film; depositing the amorphous semiconductor thin film, on the entire surface of the substrate; and thermally treating the substrate and epitaxially growing a polycrystalline semiconductor thin film from the non-metallic seeds, to thereby crystallize the amorphous semiconductor thin film.

The conventional amorphous semiconductor thin film crystallization method disclosed in the Korean Patent Registration No. 10-0653853, performing a patterning process of patterning primary amorphous silicon only in a source/drain region in order to obtain metal silicide seeds to thus crystallize the patterned primary amorphous silicon through a crystallization induced metal, to then deposit and crystallize secondary amorphous silicon by using the crystallized primary amorphous silicon as the seeds. As a result, the conventional amorphous semiconductor thin film crystallization method should perform an additional etching process, two amorphous silicon deposition processes, and two heat-treatment processes, to thereby cause the manufacturing process to be complicated and increase the manufacturing cost.

In addition, in the conventional amorphous semiconductor thin film crystallization method disclosed in the Korean Patent Registration No. 10-0653853, a photoresist is formed with a thickness of 0.2 to 1.5 um as a sacrificial organic membrane, and then the sacrificial organic membrane is removed by using an ashing method, a strip method, a dry etching method, or a wet etching method, to thus make a crystallization induced material drop down onto an amorphous silicon layer and to then use the dropped crystallization induced material as crystallization seeds.

However, the conventional amorphous semiconductor thin film crystallization method disclosed in the Korean Patent Registration No, 10-0653853, makes a direct influence upon a lower poly crystalline silicon thin film when a gas used for the dry etching method or a solution used for the wet etching method performs an etching process of removing the sacrificial organic membrane, to thereby cause a quality of a membrane between an active layer and a gate insulating layer to become uneven.

Meanwhile, in order to solve a problem of lowering characteristics the leakage current and behavior of the channel region since metal components flowing into the boundary surfaces and the channel region by the MIC phenomenon remain, an offset structure MILC crystallization method of conducting crystallization by offsetting a crystallization induced metal from the gate electrode and forming the crystallization induced metal only in the source and drain regions, has been proposed.

However, the big leakage current of the thin film transistor still exists since there exists a lot of metal silicides that are trapped in the crystalline grain, even in the case that the active layer of the channel region is crystallized by using the offset structure MILC crystallization method.

SUMMARY OF THE INVENTION

To solve the above conventional problems or defects, it is a first object of the present invention to provide a method of crystallizing an amorphous silicon thin film transistor by using a metal silicide seed induced crystallization (SIC) process that can crystallize an amorphous silicon thin film without metal contamination with a minimized process, by removing a crystallization induced metal prior to performing a crystallization heat-treatment process to thus form dot-shaped metal silicide seeds on the surface of an amorphous silicon layer, and by using the dot-shaped metal silicide seeds as crystallization heat-treatment nuclei during performing the crystallization heat-treatment process, and a method of fabricating a polycrystalline thin film transistor using the same.

It is a second object of the present invention to provide a method of crystallizing an amorphous silicon thin film transistor and a method of fabricating a polycrystalline thin film transistor using the same, in which amorphous silicon is deposited and then the deposited amorphous silicon is made to undergo a crystallization heat-treatment process before patterning the deposited amorphous silicon into an active region, to thus prevent deformation of a glass substrate and to enable a display of a large-area substrate to be manufactured.

It is a third object of the present invention to provide a method of crystallizing an amorphous silicon thin film transistor and a method of fabricating a polycrystalline thin film transistor using the same, in which the polycrystalline thin film transistor indicating leakage current characteristics of a level of about $10^{-11}$ Amp that is applicable for active matrix organic light emitting diode displays (AMOLEDs) can be manufactured by using a silicide seed induced lateral crystallization (SILC) method.

It is a fourth object of the present invention to provide a method of fabricating a polycrystalline thin film transistor using a self-aligned metal-silicide seed induced lateral crystallization (SA-SILC) method that can crystallize an amorphous silicon thin film without metal contamination, in which source and drain regions undergo a vertical crystal growth by a metal silicide seed induced crystallization (SIC) method, and a channel region under a gate undergoes a lateral crystal growth by a metal silicide seed induced lateral crystallization (SILC) method.

It is a fifth object of the present invention to provide a method of crystallizing an amorphous silicon thin film transistor and a method of fabricating a polycrystalline thin film transistor using the same, in which few metals are trapped in a channel region even if a drain voltage is increased, to thereby exert uniformity of electrical characteristics and to thus prevent an increase in a leakage current.

It is a sixth object of the present invention to provide a method of crystallizing an amorphous silicon thin film transistor and a method of fabricating a polycrystalline thin film transistor using the same, in which an amorphous silicon thin film may be crystallized without metal contamination, while a channel region under a gate undergoes a lateral crystal growth by performing a heat-treatment process by using dot-shaped metal silicide seeds as crystallization heat-treatment nuclei during performing a crystallization heat-treatment, process in which the dot-shaped metal silicide seeds remain on the surface of amorphous silicon when a crystallization induced metal is deposited on the amorphous silicon of source and drain regions and then the crystallization induced metal is removed.

It is a seventh object of the present invention to provide a method of crystallizing an amorphous silicon thin film transistor by using a silicide seed induced lateral crystallization (SILC) that can crystallize an amorphous silicon thin film of a channel region without metal contamination with a minimized process having no additional process in addition to a metal induced lateral crystallization (MILC) process, and a method of fabricating a polycrystalline thin film transistor using the same.

It is an eighth object of the present invention to provide a method, of crystallizing an amorphous silicon thin film transistor and a method of fabricating a polycrystalline thin film transistor using the same, in which a crystallization induced metal is deposited on an amorphous silicon thin film and then the crystallization induced metal is immediately removed, to thus form dot-shaped metal silicide seeds, to thus prevent, oxidation of the crystallization induced metal and prevent continuous pollution of the crystallization induced metal that has not been removed, and to reduce a manufacturing cost through simplification of a manufacturing process.

If is a ninth object of the present invention to provide a method of crystallizing an amorphous silicon, thin film transistor by using an offset silicide seed induced lateral crystallization (OS-SILC) method, that can manufacture a polycrystalline thin film transistor of excellent characteristics by conducting a silicide seed induced lateral crystallization (SILC) method while offsetting a crystallization induced metal from the gate electrode and forming the crystallization induced metal only in the source and drain regions, and a method of fabricating a polycrystalline thin film transistor using the same.

It is a tenth object, of the present invention to provide a method of crystallizing an amorphous silicon thin film transistor and a method of fabricating a polycrystalline thin film transistor using the same, in which a polycrystalline silicon thin film can be manufactured only with an inexpensive sputter and furnace without using expensive laser equipment, to thus save a manufacturing cost of an active matrix organic light, emitting diode display (AMOLED) panel, in comparison with a conventional laser crystallization method, and a compression heat-treatment process of a glass substrate is not needed prior to forming an active region, to thus allow the method of crystallizing an amorphous silicon thin film transistor and the method of fabricating a polycrystalline thin film transistor using the same to be applicable for a crystallization process of a large-area substrate more effectively than a metal induced lateral crystallization (MILC) method.

The present invention is not limited to the above embodiments, and it is possible for one who has an ordinary skill in the art to make various modifications and variations, without, departing off the spirit, of the present invention.

To accomplish the above and other objects of the present invention, according to an aspect of the present invention, there is provided a method of crystallizing an amorphous silicon thin film, the method comprising the steps of:

forming an amorphous silicon layer on a substrate;

forming a crystallization induced metal layer on the amorphous silicon layer;

forming a number of dot-shaped metal silicide seeds on the amorphous silicon layer by removing the crystallization induced metal layer; and crystallizing the amorphous silicon layer by heat-treating the substrate by using the metal silicide seeds as crystallization seeds.

Preferably but not necessarily, the method of crystallizing an amorphous silicon thin film further comprises a step of forming an active region by patterning the amorphous silicon layer, wherein the crystallization induced metal layer is formed in both a source region and a drain region that are placed on both side ends of the active region, and then immediately removed.

Preferably but not necessarily, the crystallization induced metal layer is deposited by a sputtering method.

Preferably but not necessarily, the crystallization induced metal layer is formed to have a thickness of about 50 Å to about 100 Å.

Preferably but not necessarily, the crystallization induced metal layer is any one or an alloy of two or more selected from the group consisting of Ni, Pd, Ti, Ag, Au, Al, Sn, Sb, Cu, Co, Cr, Mo, Tr, Ru, Rh, Cd, and Pt.

Preferably but not necessarily, the crystallization induced metal layer is removed using sulfuric acid ($H_2SO_4$)

Preferably but not necessarily, a density of a distribution of the metal silicide seeds is adjusted by a thickness of the crystallization induced metal layer that is formed in the amorphous silicon layer.

Preferably but not necessarily, the step of forming the crystallization induced metal layer in the source region and the drain region is performed by a lift-off method using a photoresist.

Preferably but not necessarily, the crystallization induced metal layer is formed with an offset area on both sides of a channel region to prevent the channel region disposed in the central area of an active region from being in contact with a crystallization induced metal.

According to another aspect of the present invention, there is also provided a method of manufacturing a polycrystalline thin film transistor, the method comprising the steps of:

forming an amorphous silicon layer on a substrate;

forming an active region by patterning the amorphous silicon layer;

forming a crystallization induced metal layer in both a source region and a drain region that are placed on both side ends of the active region;

forming a number of dot-shaped metal silicide seeds on the surfaces of the source region and the drain region made of amorphous silicon by removing the crystallization induced metal layer;

crystallizing the active region formed of the amorphous silicon layer by heat-treating the substrate by using the metal silicide seeds as crystallization seeds;

sequentially forming an insulating layer and an electrode material on the upper portion of the active region to then pattern the sequentially formed insulating layer and electrode material, to thus sequentially form a gate electrode and a gate insulating layer; and ion-implanting N-type or P-type dopant ions in the exposed active region, to thus form the source region and the drain region.

Preferably but not necessarily, the amorphous silicon that is provided in the source region and the drain region is crystallized into polycrystalline silicon by a vertical crystal growth using a metal silicide seed induced crystallization (SIC) method and the amorphous silicon that is provided in the remaining active region is crystallized into polycrystalline silicon by a lateral crystal growth using a metal silicide seed induced lateral crystallization (SILC) method, when crystallization is performed in the active region by using the metal silicide seeds as crystallization seeds.

According to still another aspect of the present invention, there is also provided a method of manufacturing a polycrystalline thin film transistor, the method comprising the steps of:

forming an amorphous silicon layer on a substrate;

forming an active region, by patterning the amorphous silicon layer;

sequentially forming an insulating layer and an electrode material on the upper portion of the active region to then pattern die sequentially formed insulating layer and electrode material, to thus sequentially form a gate electrode and a gate insulating layer;

forming a deposition blocking mask that surrounds the gate electrode and the gate insulating layer on the upper surface of the substrate;

allowing a number of dot-shaped metal silicide seeds to remain in the source region and the drain region of the active region made of amorphous silicon by forming a crystallization induced metal layer on die substrate by using a sputtering method, and then immediately removing the crystallization induced metal layer;

heat-treating the substrate by using the metal silicide seeds as crystallization heat-treatment nuclei, thereby crystallizing the amorphous silicon that is provided in the source region and the drain region into polycrystalline silicon by a vertical crystal growth using a metal silicide seed induced crystallization (SIC) method and thereby crystallizing the amorphous silicon that is provided in the remaining active region into polycrystalline silicon by a lateral crystal growth using a metal silicide seed induced lateral crystallization (SILC) method; and ion-implanting N-type or P-type dopant ions in the exposed active region, to thus form the source region and the drain region.

Preferably but not necessarily, the deposition blocking mask is formed to cover the gate electrode and the gate insulating layer and an offset area of the active region, in a manner that die crystallization induced metal layer is offset, from the gate insulating layer, and is formed in the source and drain regions.

Preferably but not necessarily, the offset area is set in a range of about 0.5 to about 1 μm.

According to yet another aspect of the present invention, there is also provided a method of manufacturing a polycrystalline thin film transistor, the method comprising the steps of:

forming an amorphous silicon layer on a substrate;

forming an active region by patterning the amorphous silicon layer;

sequentially forming an insulating layer and an electrode material on the upper portion of the active region to then pattern the sequentially formed insulating layer and electrode material, to thus sequentially form a gate electrode and a gate insulating layer;

allowing a number of metal silicide seeds to remain in the active region made of amorphous silicon by forming a crystallization induced metal layer on die upper surface of the substrate by using a sputtering method, and then immediately removing the crystallization induced metal layer;

heat-treating the substrata by using the metal silicide seeds as crystallization heat-treatment, nuclei, thereby crystallizing the amorphous silicon that is provided in the active region exposed to the outside of the gate insulating layer into polycrystalline silicon by a vertical crystal growth using a metal silicide seed induced crystallization (SIC) method and thereby crystallizing the amorphous silicon that is provided in the lower portion of the gate insulating layer into polycrystalline silicon by a lateral crystal growth using a metal silicide seed induced lateral crystallization (SILC) method; and ion-implanting N-type or P-type dopant ions in the active region of the polycrystalline silicon, to thus form a source region and a drain region,

ADVANTAGEOUS EFFECTS

As described above, when an amorphous silicon thin film is crystallized by using a metal silicide seed induced crystallization (SIC) process, the present, invention can crystallize the amorphous silicon thin film without metal contamination with a minimized process, by removing a crystallization induced metal prior to performing a crystallisation heat-treatment process to thus form a number of dot-shaped metal silicide seeds on the surface of an amorphous silicon layer, and by using the dot-shaped metal silicide seeds as crystallization heat-treatment nuclei during performing the crystallization heat-treatment process.

In addition, according to the present invention, amorphous silicon is deposited and then the deposited amorphous silicon is made to undergo a crystallization heat-treatment process before patterning the deposited amorphous silicon into an active region, to thus prevent deformation of a glass substrate and to enable a display of a large-area substrate to be manufactured.

Further, when an amorphous silicon thin film is crystallized by using a silicide seed induced lateral crystallization (SILC) method, according to the present invention, an amorphous silicon thin film, may be crystallized without metal contamination, while source and drain regions undergo a vertical crystal growth to thus be crystallized into polycrystalline silicon and a channel region under a gate undergoes a lateral crystal growth, by performing a heat-treatment process by using dot-shaped metal silicide seeds remaining on the surface of amorphous silicon as crystallization heat-treatment nuclei, to thereby manufacture a polycrystalline thin film transistor of excellent characteristics.

That is, the present invention can fabricate a polycrystalline thin film transistor, indicating leakage current characteristics of a level of about $10^{-11}$ Amp that is applicable for active matrix organic light emitting diode displays (AMOLEDs) by using a silicide seed induced lateral crystallization (SILC) method.

In addition, the present invention can crystallize an amorphous silicon thin film of a channel region without metal contamination with a minimized process having no additional process in addition to a metal induced lateral crystallization (MILC) process, to thereby achieve commercialization easily.

In addition, according to the present invention, a crystallization induced metal is deposited on an amorphous silicon thin film and then the crystallization induced metal is immediately removed, to thus form dot-shaped metal silicide seeds, to thus prevent oxidation of the crystallization induced metal and prevent continuous pollution of the crystallization induced metal that has not been removed, and to reduce a manufacturing cost, through simplification of a manufacturing process.

Moreover, the present invention can manufacture a polycrystalline thin film transistor of excellent leakage current characteristics by conducting a silicide seed induced lateral crystallization (SILC) method while offsetting a crystallization induced metal from the gate electrode and forming the crystallization induced metal only in the source and drain regions.

The present invention can prevent a continuous inflow of a crystallization induced metal deposited by a metal induced lateral crystallization (MILC) method during performing a crystallization heat-treatment process, to thus minimize metal contamination of a channel region, and to thereby manufacture a thin film transistor of excellent electrical characteristics.

In other words, the present invention exerts uniformity of electrical characteristics that does not cause an increase in a leakage current, since few metals are trapped in a channel region even if a drain voltage is increased, to thereby.

In addition, according to the present invention, a polycrystalline silicon thin film can be manufactured only with an inexpensive sputter and furnace without using expensive laser equipment, to thus save a manufacturing cost, of art active matrix organic light emitting diode display (AMOLED) panel in comparison with a conventional laser crystallization method, and a compression heat-treatment process of a glass substrate is not needed prior to forming an active region, to thus be applicable for a crystallization process of a large-area substrate more effectively than a metal induced lateral crystallization (MILC) method.

DETAILED DESCRIPTION OF THE INVENTION

Figure 1:
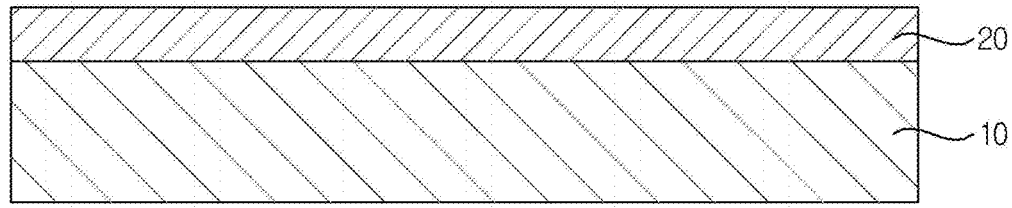
FIGS. 1 to 10 are cross-sectional views sequentially illustrating a method of manufacturing a polycrystalline thin film transistor according to an embodiment of the present invention.

The above and/or other objects and/or advantages of the present invention will become more apparent by the following description. Preferred embodiments according to the present invention will now be described in detail with reference to the accompanying drawings. Here, size or shape of components shown in the drawings may be shown exaggerated for convenience and clarity of explanation. In addition, by considering configuration and operation of the present invention, specifically defined terminologies may vary according to intents or customs of users or operators. Definitions for these terms should be made on the basis of contents throughout this specification.

FIGS. 1 to 10 are cross-sectional views sequentially illustrating a method of manufacturing a polycrystalline thin film transistor according to a first embodiment of the present invention.

The method of crystallizing an amorphous silicon thin film according to the first embodiment of the present invention will now be described with reference to FIGS. 1 to 4.

First, as shown in FIG. 1, an amorphous silicon layer 20 is deposited on a substrate 10.

The substrate 10 may be formed by using a transparent, insulating substrate such as a glass substrate.

A method of depositing an amorphous silicon layer 20 may be performed by using a low pressure chemical vapor deposition (LPCVD) method or a plasma enhanced chemical vapor deposition (PECVD) method.

Meanwhile, the amorphous silicon layer 20 may be deposited to a thickness of about 400 Å to about 1000 Å, preferably a thickness of about 800 Å.

In this case, after having formed the amorphous silicon layer 20, it is also possible to perform an ongoing process after patterning the amorphous silicon layer to thus be created into an active region according to the necessity.

Figure 5:
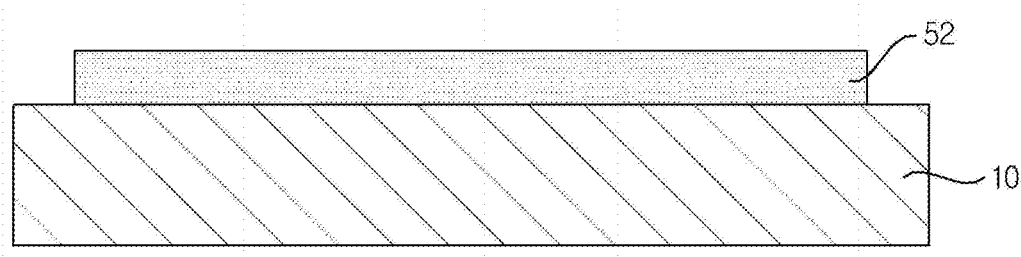

In other words, in a subsequent process shown in FIG. 5, a polycrystalline silicon layer that is obtained by crystallizing the amorphous silicon layer 20 is patterned into an active region. Here, it is also possible to perform an ongoing process after patterning an amorphous silicon layer into an active region 52 in advance.

A photolithography process may be used as a method of patterning the amorphous silicon layer 20 into an active region. Dry etching and wet etching may be used as an etching process. For the dry etching, a reactive ion etching (RIE) process may be used by mixing a $SF_6$ gas and an $O_2$ gas, and for the wet etching, a mixed solution of a $HNO_3$ solution and a HF solution may be used.

Figure 2:
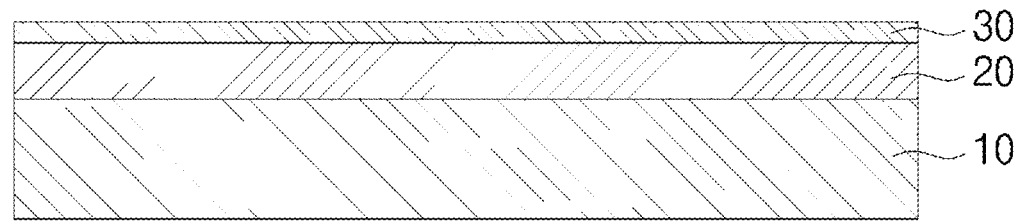

After that, as shown in FIG. 2, a crystallization induced metal layer 30 is formed on the surface of the amorphous silicon layer 20. Here, the crystallization induced metal layer 80 may be formed of any one or an alloy of two or more selected from the group consisting of Ni, Pd, Ti, Ag, Au, Al, Sn, Sb, Cu, Co, Cr, Mo, Tr, Ru, Rh, Cd, and Pt, as a metal that reacts with the amorphous silicon layer 20 to thus induce crystallization of the amorphous silicon layer 20.

It is desirable that the crystallization induced metal layer 30 is formed by deposition, for example, in a sputtering manner. The crystallization induced metal layer 30 may be formed to a thickness of about 50 Å to about 100 Å in the range of the room temperature to 200° C., by using a sputtering method.

Figure 3:
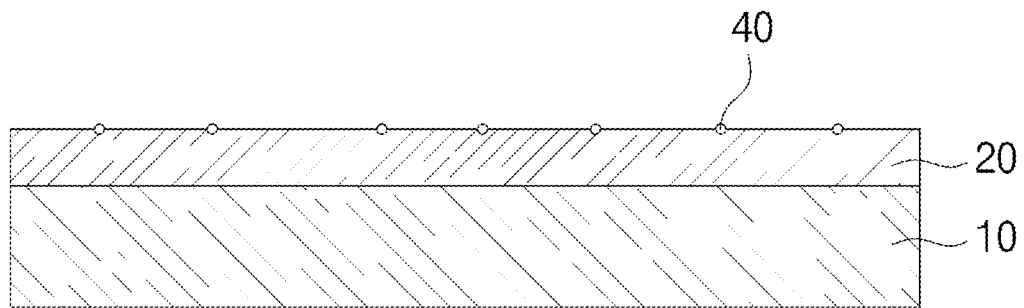

Subsequently, as shown in FIG. 3, the crystallization induced metal layer 30 is removed. In other words, when the crystallization induced metal layer 30 that, was deposited on top of the amorphous silicon layer 20 is removed, dot-shaped metal silicide seeds 40 remain on the surface of the amorphous silicon layer 20, with a constant density.

The crystallization induced metal layer 30 may be removed by using an acid solution such as a sulfuric acid ($H_2SO_4$) solution in the range of the room temperature to 100° C. In this case, it is preferable that a mixed solution of sulfuric acid and hydrogen peroxide at a 3:2 ratio is heated to a temperature of 70° C. to then be used, as the acid solution for removing the crystallization induced metal layer 30. All metals except for lead (Pb) and mercury (Hg) can be removed by using the solution.

Any methods of leaving the metal silicides on top of the amorphous silicon layer 20 and removing the crystallization induced metal layer 30 can be used in the method of removing the crystallization induced metal layer 30.

As described above, when the crystallization induced metal layer 30 is removed, a crystallization induced metal is combined with a silicon atom to thus leave dot-shaped metal silicides that are created by a silicidation process on the surface of the amorphous silicon layer 20 during the sputtering process of the crystallization induced metal. When the remaining dot-shaped metal silicides are heat-treated for crystallization, it acts as seeds for crystallizing amorphous silicon, that is, as nuclei for growth of grains, to thereby crystallize the amorphous silicon into polycrystalline silicon (poly-Si), and to thus achieve crystallization at a low temperatures lower than about 600° C.

Here, a density of distribution of metal silicide seeds 40 may be controlled by adjusting thickness of the crystallization induced metal layer 30. That is, the metal silicide seeds 40 may be controlled to be distributed in a proper distribution density, by adjusting thickness of the crystallization induced metal layer 30.

Figure 4:
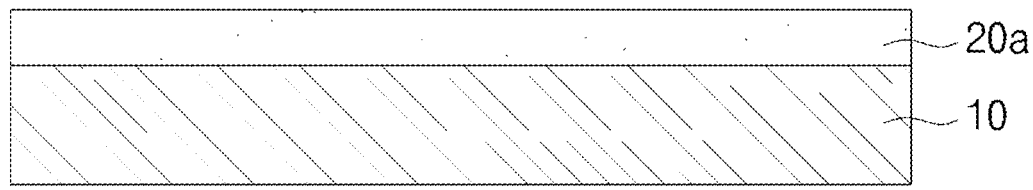

As shown in FIG. 4, when the metal silicide seeds 40 are formed on the amorphous silicon layer 20, by removing the crystallization induced metal layer 30 immediately after the crystallization induced metal layer 30 has been deposited, the entire amorphous silicon layer 20 is heat-treated for crystallization. Here, it is desirable that a heat-treatment process is performed, for example, at about 500° C. to about 600° C. for about 2 to about 6 hours. That is, the amorphous silicon layer 20 is crystallized by the metal silicide seed induced crystallization (SIC) method, to thereby form a polycrystalline silicon layer 20a.

Figure 14A:
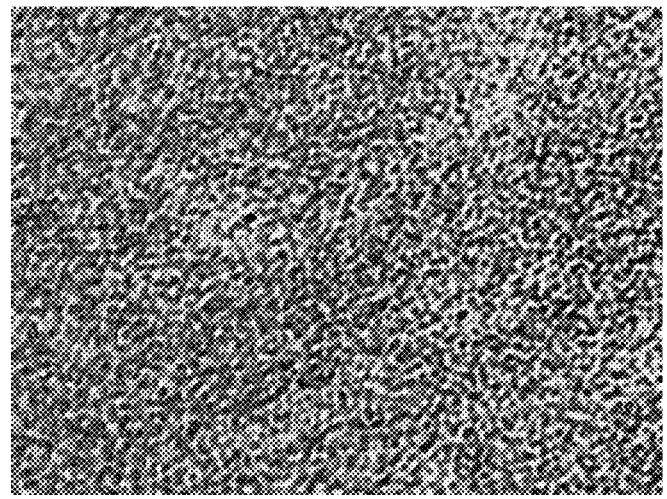
FIGS. 14A and 14B are micrographic views illustrating Secoo-etched polycrystalline silicon crystallized by a metal induced crystallization (MIC) method and a silicide seed induced crystallization (SIC) method.
Figure 14B:
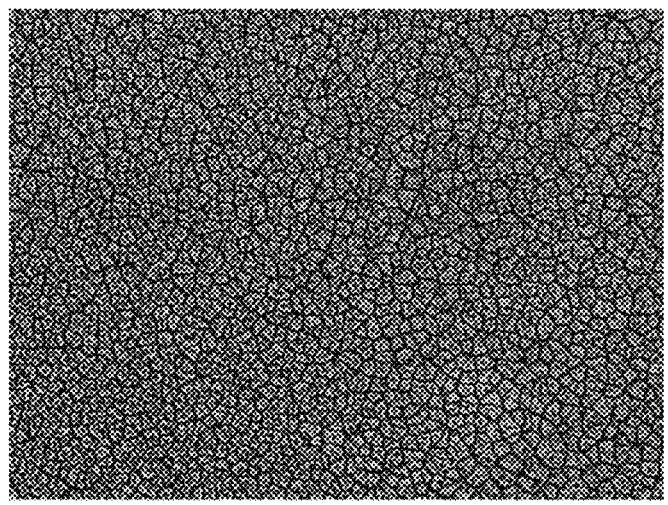

In this case, when the amorphous silicon layer 20 is heat-treated, a crystalline growth is achieved in vertical and circumferential directions from each of the dot-shaped the metal silicide seeds 40 as illustrated in FIG. 14B, to thus crystallize the entire amorphous silicon layer 20 into the polycrystalline silicon layer 20a.

As described above, in the method of crystallizing the amorphous silicon thin film according to the present invention, the crystallization induced metal layer 30 is deposited on the surface of the amorphous silicon layer 20 by the sputtering method and then the deposited crystallization induced metal layer 30 is eliminated by using an acidic solution. Accordingly, when the crystallization induced metal layer 30 is deposited by the sputtering method, the silicides bonded with the amorphous silicon layer 20 are not removed due to the plasma energy and remains in the form of dots on the surface of the amorphous silicon layer 20. The remaining dot-shaped metal silicides act as crystallization heat-treatment seeds, to thus crystallize an amorphous silicon thin film at low temperatures.

In addition, the above-described metal silicide seeds 40 are probabilistically combined with silicon due to the plasma energy and are formed in the form of dots, when the crystallization induced metal layer 30 is deposited by the sputtering method, to thereby obtain a polycrystalline silicon thin film in which uniformity of grains is improved. The polycrystalline silicon thin film is made larger since the dot-shaped metal silicide seeds 40 plays a role of acting as nuclei for a grain growth to make grains grow. As a result, the thin film transistors that are fabricated by using the larger polycrystalline silicon thin films may cause leakage currents to be reduced as will be described later.

Moreover, in the case that the amorphous silicon thin film is crystallized by a crystallization method using a silicide seed induced lateral crystallization (SILC) process according to the present invention, metal contamination that is the biggest problems of the metal induced crystallization may be minimized, to thus fabricate a high-performance polycrystalline silicon thin film transistor whose leakage current is reduced as will be described later.

A method of manufacturing a thin film transistor using a polycrystalline silicon layer obtained by the crystallization method using the SIC process in accordance with the present invention will be described below with reference to FIGS. 5 to 10.

First, as shown in FIG. 5, the polycrystalline silicon layer 20a that has been crystallized through the SIC process is patterned by using a photolithography process to thus form an active region 52.

First, for patterning using the photolithography process, for example, a photoresist (PR) is used to form an etch mask corresponding to the active region 52, and then an etching process can proceed by using the etch mask. A dry etching method and a wet etching method may be used as the etching process. For the dry etching method, a reactive ion etching (RIE) process may be used by mixing a $SF_6$ gas and an $O_2$ gas, and for the wet etching method, a mixed solution of a $HNO_3$ solution and a HF solution may be used.

Figure 6:
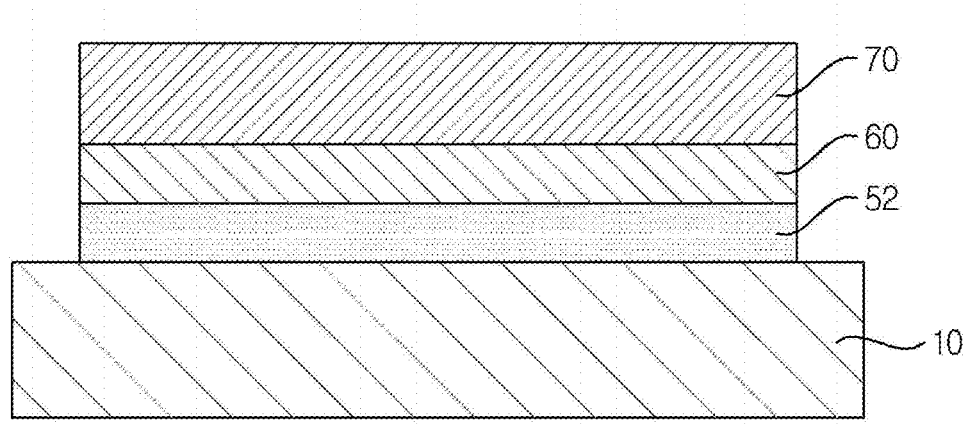

Next, as shown in FIG. 6, an insulating layer 60 for forming a gate insulating layer is formed on the surface of the active region 52, and then a metal layer 70 for forming a gate electrode is formed on the surface of the insulating layer 60. Here, a silicon oxide ($SiO_2$) layer or a silicon nitride ($Si_3N_4$) layer may be used, as the insulating layer 60, and conductive materials such as W, Pt, Ti, Al, Ni, and Mo may be used as the metal layer 70 for forming a gate electrode.

Figure 7:
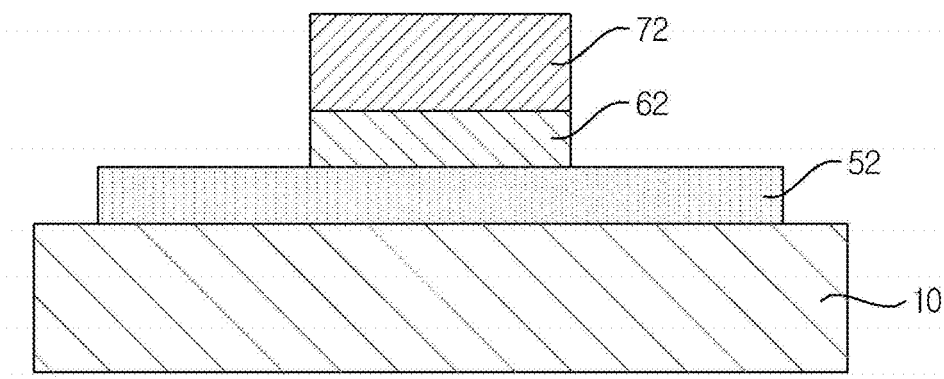

After having deposited the insulating layer 60 and metal layer on 70, an etch mask is formed by using a photoresist on top of the metal layer 70. Then, the metal layer 70 for forming a gate electrode and the insulating layer 60 for forming a gate insulating layer are sequentially etched to thereby form a gate electrode 72 and a gate insulating layer 62, as shown in FIG. 7.

Figure 8:
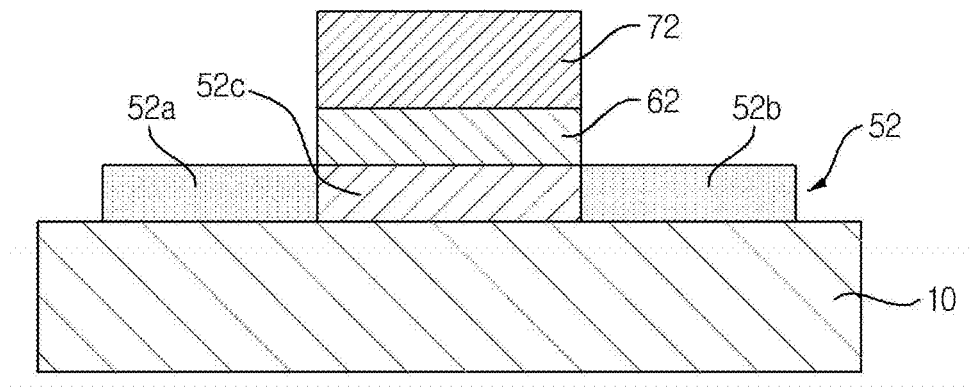

After that, as shown in FIG. 8, N-type or P-type dopant ions are ion-implanted into the active region 52 made of the polycrystalline silicon crystallized by the SIC method by using the etch mask as an ion-implantation mask, to thus define a source region 52a and a drain region 52b, respectively.

In this case, for example, P, $PH_3$, or As may be used the N-type dopant and B, $B_2H_6$ or $BH_3$ may be used as the P-type dopant. As a result, a region where no dopant has been injected between the source region 52a and the drain region 52b becomes a channel region 52c.

Once the source region 52a and the drain region 52b are completely doped, the substrate 10 is heat-treated at a temperature between about 400° C. and about 600° C., under an atmosphere of hydrogen, for example, for about one hour to about five hours at about 550° C., to thus activate the dopant injected into the source region 52a and the drain region 52b, and to remove a dangling bond, and to thereby reduce the leakage current of the manufactured thin film transistor.

Figure 9:
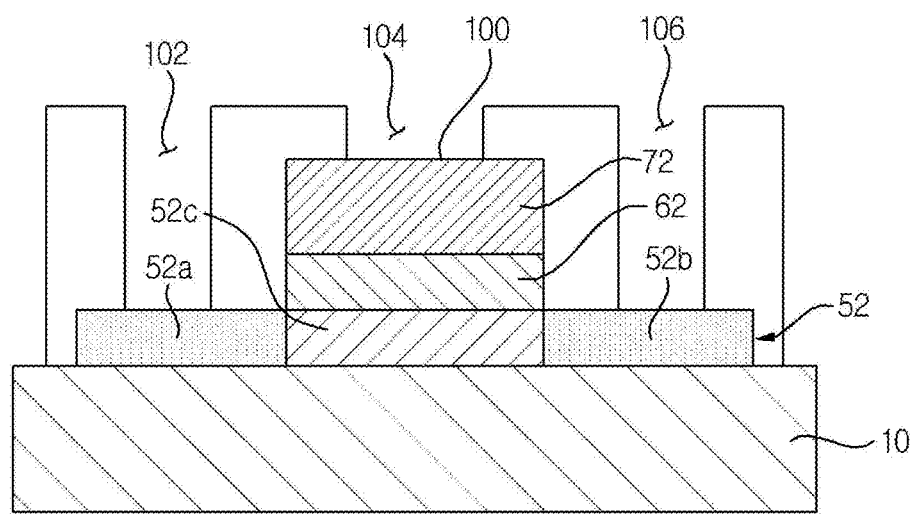
Figure 10:
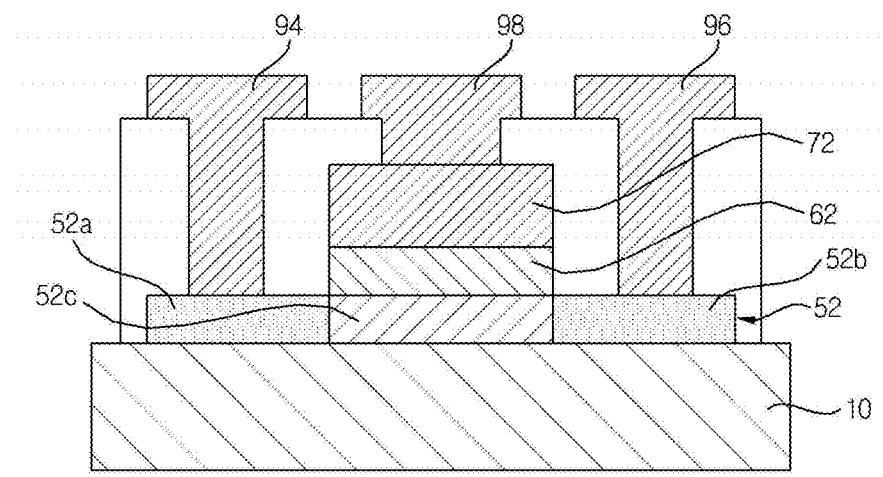

Finally, as shown in FIGS. 9 and 10, according to an existing process, an interlayer insulating layer 90 is formed on the substrate 10, and some portions of the interlayer insulating layer 90 are etched to thus form contact windows 102, 106, and 104 for the source region 52a, the drain region 52b, and a gate region 100 of the gate electrode 72. Thereafter, a source electrode 94, a drain electrode 96, and a gate electrode 98 are formed by using a conductive material, to thereby complete a thin film transistor.

Example 1

According to a first exemplary embodiment of the present invention, a polycrystalline silicon thin film transistor using a metal silicide seed induced crystallization (SIC) method was fabricated, to then measure characteristics of a polycrystalline silicon thin film and the thin film transistor.

First, an amorphous silicon thin film of about 100 nm was deposited on a glass substrate (e.g., Corning eagle XG) for a flat panel display on which buffer oxide of about 300 nm was deposited using a $SiH_4$ gas at about 500° C. by a low pressure chemical vapor deposition (LPCVD) method.

Thereafter, a native oxide layer formed on the surface of the amorphous silicon was removed by using an approximately 1% diluted HF solution, and nickel (Ni) of about 5 nm was deposited thereon at the room temperature by a DC magnetron sputter method. In order to remove the deposited nickel (Ni) immediately before performing the crystallization heat-treatment process, the glass substrate was soaked in a sulfuric acid ($H_2SO_4$) solution for about 30 min at about 70° C. In this process, the sulfuric acid ($H_2SO_4$) solution reacts with the surface of the amorphous silicon and thus the nickel (Ni) silicides that were undergone silicidation was not removed but the nickel that was not undergone silicidation was removed.

Figure 11A:
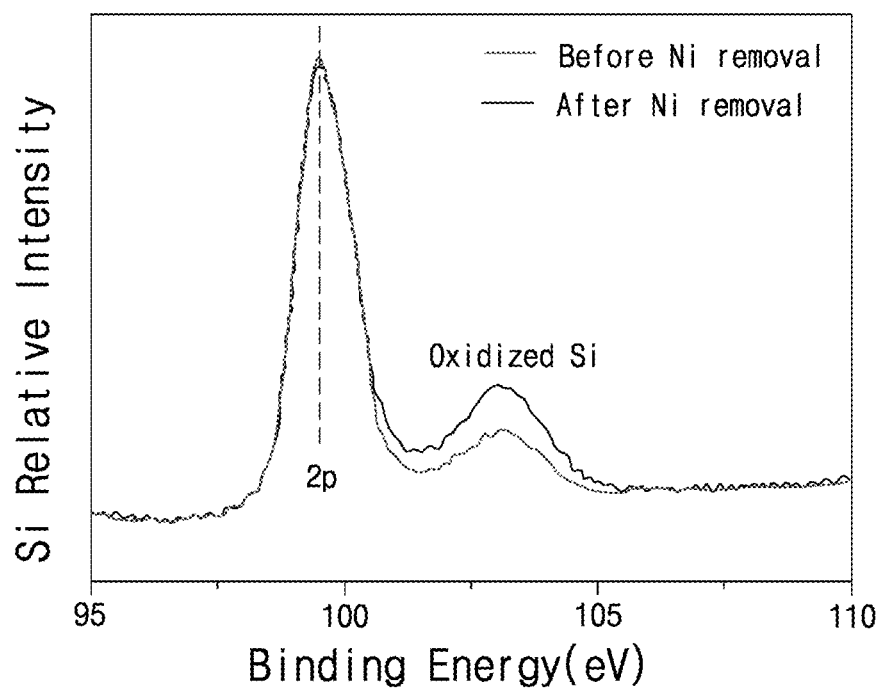
FIGS. 11A and 11B are graphical views illustrating change of XPS (X-ray photoelectron spectroscopy) spectrum of Si and Ni before and after removing Ni deposited on amorphous silicon, respectively.
Figure 11B:
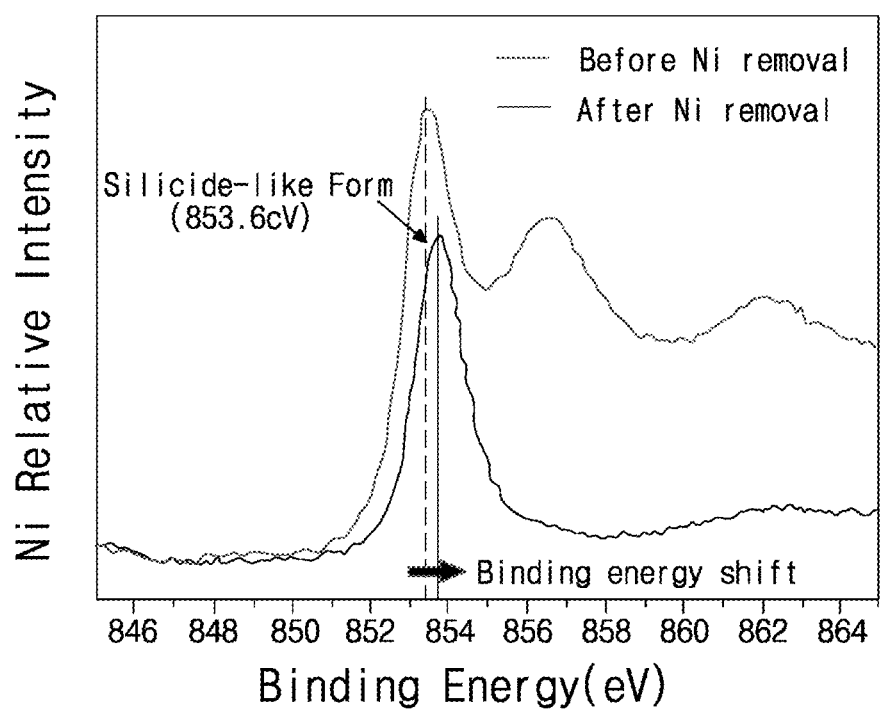

FIGS. 11A and 11B are graphical views illustrating change of XPS (X-ray photoelectron spectroscopy) spectrum of Si and Ni before and after removing Ni deposited on amorphous silicon, respectively.

In FIG. 11A, the Si peak represents that binding energy is 99.5 eV before and after removing the nickel (Ni), but the broadly oxidized Si peak represents that binding energy varies. The binding energy of the oxidized Si peak before removal of Ni is lower than that after removal of Ni. This indicates that the exposed Si was chemically oxidized during removal of Ni in a sulfuric acid.

As shown in FIG. 11B, in the case that the oxidized Ni (mixture of NiO and $NiO_2$) and the deposited Ni on the amorphous silicon was removed by dipping the substrate in the sulfuric acid solution of about 70° C. for about 30 minutes, only silicide-like form exists. In this case, the binding energy was confirmed as 853.6 eV. It was confirmed that the binding energy of Ni2p was shifted. The changes in the binding energy reflect charge transfer from Ni to Si at the time of forming a Ni—Si bond. Thus, the presence of a Ni—Si bond as silicide seeds formed nuclei for crystallization during a heat-treatment process.

XPS (X-ray photoelectron spectroscopy) is an analysis method of giving information on how some certain atoms exist and are combined. As shown in the graph of FIG. 11B. It may be confirmed that silicide-like form remains even when Ni was removed. This indicates that Ni that forms the silicide-like form by being combined with silicon when the sulfuric acid etches Ni has a stronger adhesion with silicon and thus remains unremoved.

Figure 12:
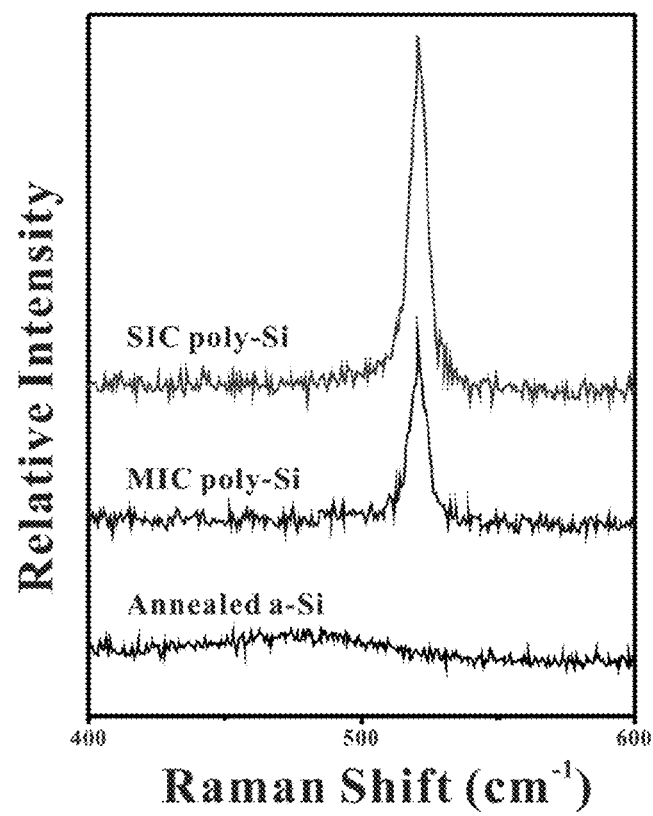
FIG. 12 is a graphical view illustrating nickel silicide seed induced crystallization (SIC) silicon that was analyzed by Raman spectroscopy.

FIG. 12 is a graphical view illustrating Raman spectrums of a crystallization heat-treated amorphous silicon (a-Si) thin film, a MIC polycrystalline silicon (poly-Si) thin film, and a SIC polycrystalline silicon (poly-Si) thin film.

In order to analyze a thin, film by Raman spectroscopy, a heat-treated amorphous silicon (a-Si) thin film without having a Ni layer, a metal induced crystallization (MIC) layer equipped with a Ni layer, and a nickel silicide seed induced crystallization (SIC) silicon layer were prepared. Then, Raman spectrums of three samples were measured and the measured results are illustrated in the graph of FIG. 12. The SIC polycrystalline silicon according to the present invention was obtained by removing Ni from the surface of the amorphous silicon of thickness of about 100 nm to then be heat-treated for crystallization for about 1 hour at about 500° C.

As shown in the graph of FIG. 12, according to the analyzed results by the Raman spectroscopy, the spectrum of the amorphous silicon (a-Si) thin film showed a broad structure near about 480 cm$^{-1}$, and represents amorphous silicon (a-Si). The polycrystalline silicon peak appears near about 520 cm$^{-1}$. It can be seen that crystallinity of the SIC poly-Si is high compared to the MIC poly-Si since the SIC poly-Si is the highest, in the relative intensity. In this case, the reason why the broad peak centered at about 480 cm$^{-1}$ does not appear indicates that the MIC poly-Si and the SIC poly-Si occur, and indicates that the amorphous silicon thin film was heat treated for about 1 hour at about 500° C. to then carry out crystallization entirely.

Figure 13:
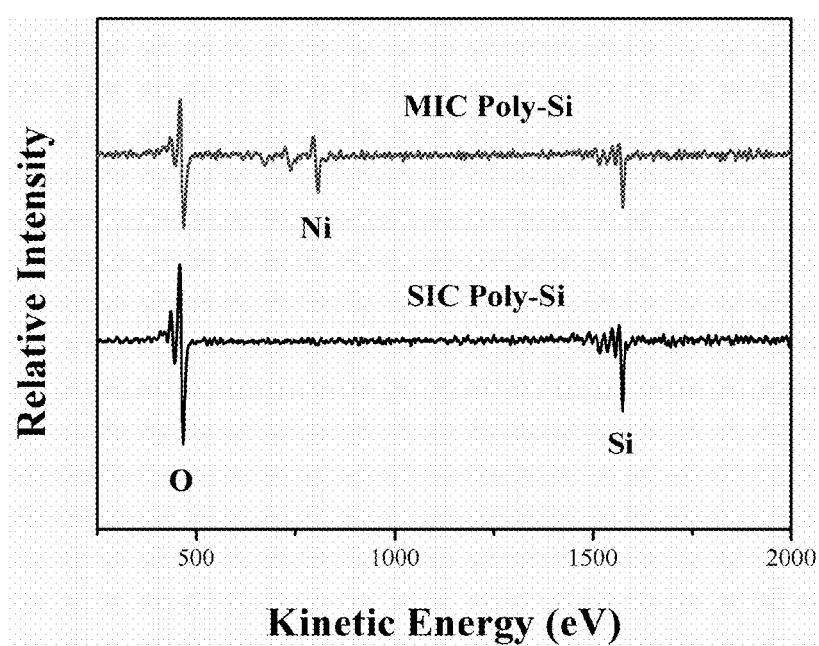
FIG. 13 is a graphical view illustrating the amount of oxygen, nickel and silicon atoms remaining on the surface of polycrystalline silicon that was analyzed by AES (Auger electron spectroscopy), after amorphous silicon had been crystallized by two ways of a metal induced crystallization (MIC) method and a silicide seed induced crystallization (SIC) method.

In addition, in order to investigate contamination of Ni, the amount of oxygen (O), nickel (Ni), and silicon (Si) atoms remaining on the surface of the polycrystalline silicon were analyzed by AES (Auger electron spectroscopy) after crystallization in two ways of MIC and SIC. AES spectrums of both the MIC and SIC polycrystalline silicon (poly-Si) were measured and illustrated in FIG. 13.

Figure 18:
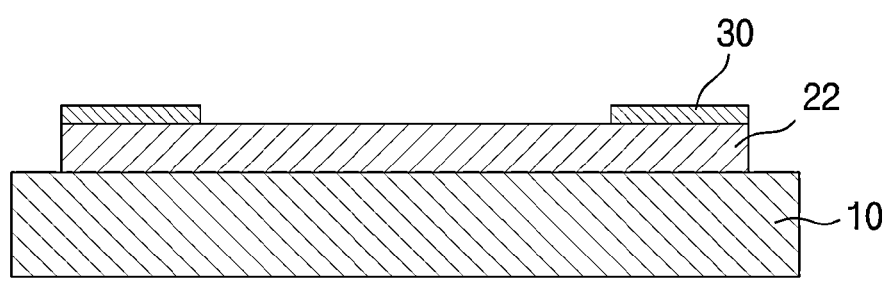

Referring to the graph of FIG. 18, in the result of the AES analysis, polycrystalline silicon crystallized by MIC indicates that the Ni peak appeared at 770 eV, but polycrystalline silicon crystallized by SIC indicates that the Ni peak did not appear. As a result, it can be seen that nickel contamination was minimized in the polycrystalline silicon crystallized by SIC.

TABLE 1

Relative atomic percent [%] of each element
on the surfaces of MIC and SIC poly-Si

|    | MIC poly-Si | SIC poly-Si |
|----|-------------|-------------|
| O  | 60.90       | 84.77       |
| Si | 4.22        | 5.63        |
| Ni | 16.26       | 1.79        |

The percentage of nickel, silicon, and oxygen in the polycrystalline silicon, is summarized and represented in Table 1.

As shown in Table 1, it can be confirmed, that content of nickel in the polycrystalline silicon crystallized by the MIC method was about 16.26%, but content of nickel in the polycrystalline silicon crystallized by the SIC method was extremely reduced to about 1.79%.

In order to investigate the surfaces of the MIC and SIC poly-Si samples using an optical microscope and an scanning electron microscope (SEM), the samples were Secco-etched. Amorphous silicon and Ni silicides may be selectively etched from the crystalline silicon (Si) by using a Secco etchant.

FIG. 14A is a micrographic view illustrating Secoo-etched polycrystalline silicon crystallized by a metal induced, crystallization (MIC) method. The MIC polycrystalline silicon represents a very porous structure, and it cannot be observed that grains are entirely formed due to etching of the crystallized region. As a result, it can be seen that most of the polycrystalline silicon undergoes silicidation such that content of nickel is very high.

In the case of SIC of FIG. 14B, it can be seen that certain grains were formed. This means that the dot-shaped silicide seeds that are formed when nickel (Ni) acts with silicon in a process where nickel is deposited at the room temperature through a sputtering method are used as nuclei at the time of performing a crystallization heat-treatment process, to thus crystallize amorphous silicon by a grain growth.

Figure 14C:
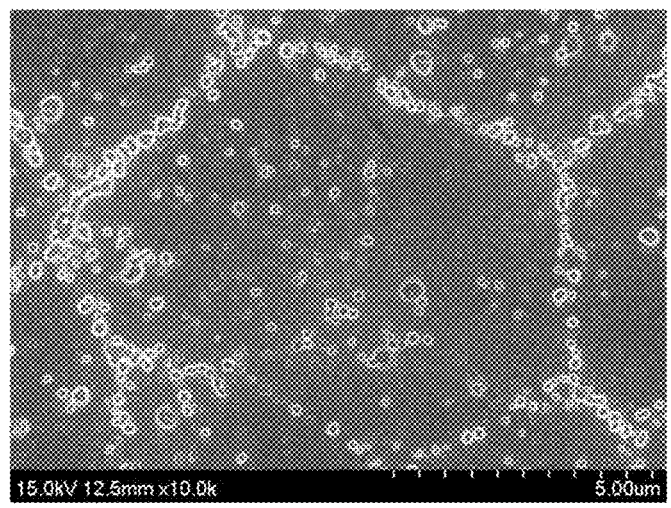
FIG. 14C is a photographical view in which a portion of the Secoo-etched polycrystalline silicon of FIG. 14B is enlarged.
Figure 14D:
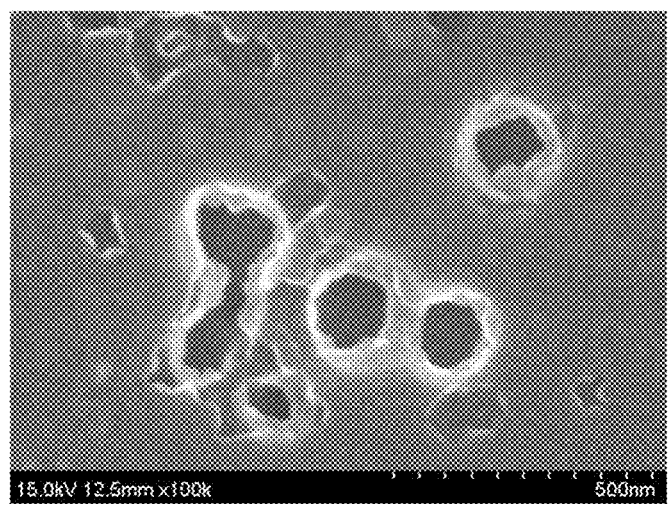
FIG. 14D is a photographical view in which a portion of the Secoo-etched polycrystalline silicon of FIG. 14C is enlarged.

FIG. 14C is a photographical view in which a portion of the Secoo-etched polycrystalline silicon of FIG. 14B is enlarged, and FIG. 14D is a photographical view in which a portion of the Secoo-etched polycrystalline silicon of FIG. 14C is enlarged. From the photo of FIG. 14C, it can be seen that silicides existing in the leading end of a crystallization growth are segregated and positioned in the grain boundaries.

In order to determine electrical properties of the polycrystalline silicon formed through the MIC and SIC methods, in this way, polycrystalline silicon transistors were fabricated by using the above-described obtained MIC and SIC polycrystalline silicon thin films, respectively.

First, the two polycrystalline silicon thin films were patterned into active regions by using a photolithographic method, in which etching was done in a O2 RIE (Reactive Ion Etching) method by using a $SF_6$ gas and an oxygen ($O_2$) gas.

After this, a gate insulating layer is deposited with SiO2 of about 100 nm by a PECVD (plasma enhanced chemical vapor deposition) method, and a gate electrode is deposited with MoW of about 200 nm by a sputtering method.

A photolithography process was done for performing a patterning process for forming a gate electrode after deposition, in which an etchant of $H_3PO_4$+$CH_3COOH$+$HNO_3$+$H_2O$ was used for etching of the gate electrode, and the gate insulating layer was etched by the RIB method using a $CHF_4$, Ar, or $SF_6$ gas.

Impurities of $B_2H_6$ were injected with the intensity of RF 150 W and DC 17 keV through an IMD (Ion mass doping) device in order to form source/drain regions, and a protective layer was deposited on the entire specimen by using an insulator ($SiO_2$). Thereafter, the entire specimen was heat-treated for about one hour at about 550° C., to thus activate the impurities, and contact windows were made in the gate, source and drain for being in contact with electrodes, to then carry out a metal wiring process called metallization.

This whole process was carried out in a clean room of 1000-Class, and a Keythley 2636 system was used for measurement of electrical characteristics.

Figure 15:
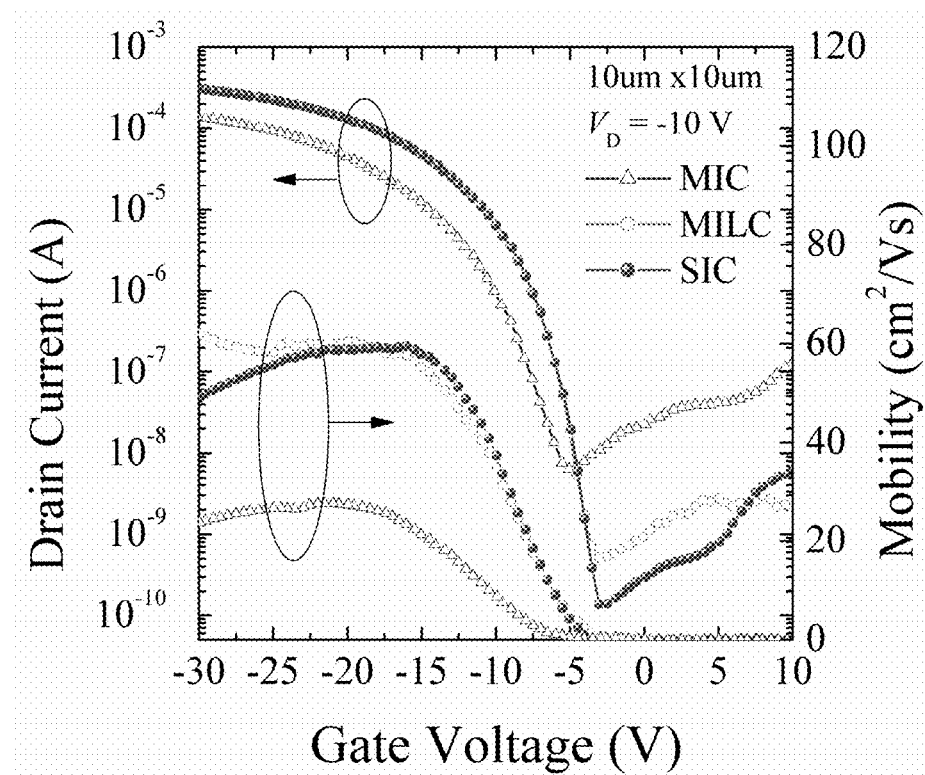
FIG. 15 is a graphical view respectively illustrating electrical characteristics of a p-channel polycrystalline silicon thin film transistor that is fabricated by the metal induced crystallization (MIC), metal induced lateral crystallization (MILC), and silicide seed induced crystallization (SIC) methods.

Electrical characteristics of p-channel polycrystalline silicon thin film transistors that are fabricated by the MIC, MILC, and SIC methods, are illustrated in the graph of FIG. 15 and Table 2.

TABLE 2

Device parameters of three crystallization polycrystalline silicon TFTs

| Parameters | MIC | MILC | SIC |
|---|---|---|---|
| Field-effect mobility pFE(cm$^2$/V-s) | 29.86 ± 4.0 | 57.6 ± 3.5 | 62.08 ± 3.8 |
| Threshold voltage $V_{th}$(V) | 10.11 ± 1.04 | 7.52 ± 0.86 | 7.42 ± 0.98 |
| Subthreshold slope S.S(V/dec) | 1.56 ± 0.23 | 0.9 ± 0.11 | 0.73 ± 0.08 |
| Minimum leakage current $I_{min}$(×10$^{-10}$ A) | 63.7 ± 3.41 | 2.76 ± 3.51 | 1.17 ± 3.55 |
| Maximum on current $I_{ON}$(×10$^{-4}$ A) | 1.40 ± 1.12 | 3.10 ± 1.11 | 3.07 ± 0.85 |
| Maximum on/off ratio (×10$^8$) | 0.21 | 11.23 | 17.87 |

As shown in Table 2, when compared with electrical characteristics of MIC-TFT and SIC-TFT, it can be seen that a field-effect mobility was about 29.86±4.0 cm$^2$/V-s in the case of using the MIC method, but became remarkably high as about 62.08±3.8 cm$^2$/V-s in the case of using the SIC method.

In addition, it can be seen that the minimum leakage current was about 63.7±3.41 (×10$^{-10}$ A) in the case of using the MIC method, but became remarkably small as about 1.17±3.55 (×10$^{-10}$ A) in the case of using the SIC method.

Moreover, the maximum on/off ratio was about 0.21 (×10$^5$) in the case of the MIC method but became remarkably increased as about 17.87 (×10$^5$) in the case of using the SIC method.

In addition, when compared with electrical characteristics of MILC-TFT and SIC-TFT, it can be seen that electrical characteristics of SIC-TFT is similar or superior to those of MILC-TFT. In particular, it can be seen that the minimum leakage current was about 2.76±3.51 (×10$^{-10}$ A) in the case of the MIC method, but became as small as ½ or less as about 1.17±3.55 (×10$^{-10}$ A) in the case of the SIC method.

Improvement of the leakage current is attributed to reduction of concentration of nickel (Ni) in the polycrystalline silicon thin film. If concentration of nickel (Ni) decreases, size of the grain is enlarged. This promotes improvement of electrical properties. The size of the grain influences the electrical properties such as an on-state current.

FIGS. 16 to 25 are cross-sectional views sequentially illustrating a method of manufacturing a polycrystalline thin film transistor according to a second embodiment of the present invention.

The method of crystallizing an amorphous silicon thin film according to the second embodiment of the present invention will now be described with reference to FIGS. 16 to 20.

Figure 16:
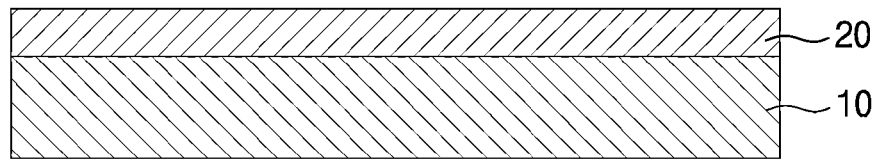
FIGS. 16 to 25 are cross-sectional views sequentially illustrating a method of manufacturing a polycrystalline thin film transistor according to a second embodiment of the present invention.

First, as shown in FIG. 16, an amorphous silicon layer 20 is deposited on a substrate 10. The substrate 10 may be formed by using a transparent insulating substrate such as a glass substrate.

A method of depositing an amorphous silicon layer 20 may be performed by using a low pressure chemical vapor deposition (LPCVD) method or a plasma enhanced chemical vapor deposition (PECVD) method. The amorphous silicon layer 20 may be deposited to a thickness of about 400 Å to about 1000 Å, preferably a thickness of about 800 Å.

Figure 17:
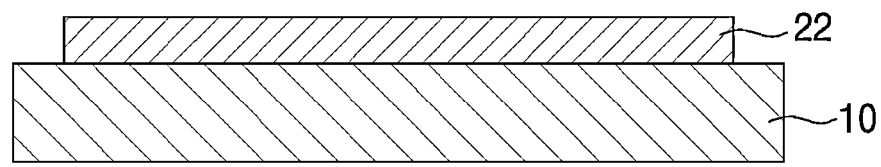

After that, as shown in FIG. 17, an amorphous silicon layer 20 is patterned to form an active region 22. A photolithography process may be used as a method of patterning the amorphous silicon layer 20. Dry etching and wet etching may be used as an etching process. First, for patterning using the photolithography process, for example, a photoresist (PR) is used to form an etch mask corresponding to the active region 22, and then an etching process can proceed by using the etch mask.

For the dry etching, a reactive ion etching (RIE) process may be used by mixing a SF$_6$ gas and an O$_2$ gas, and for the wet etching, a mixed solution of a HNO$_3$ solution and a HF solution may be used.

After that, as shown in FIG. 18, a crystallization induced metal layer 30 is selectively deposited on a portion of the active region 22 made of amorphous silicon, that is, in a source and drain regions, by a sputtering method. The crystallization induced metal layer 30 may be formed to a thickness of about 50 Å to about 100 Å in the range of the room temperature to 200° C., by using a sputtering method.

in other words, the crystallization induced metal layer 30 is formed only in first and second regions 51a and 51b, corresponding to source and drain regions 52a and 52b (see FIG. 23) with an offset from both side surfaces of a gate electrode 72 that is formed on top of a channel region 52c in a subsequent process, from the active region 22. Patterning of the crystallization induced metal layer 30 may be achieved by using a lift-off method in which a photoresist pattern is selectively formed on the gate electrode 72 and offset portions 51d and 51e as a deposition blocking mask for selectively depositing a crystallization induced metal, and then forming the crystallization induced metal layer 30, to then remove the photoresist pattern. Accordingly, it is desirable that an offset is set in order that the crystallization induced metal does not contact the channel portion of the active region 22. It is desirable that the offset area is set in a range of about 0.5 to about 1 μm.

A material that may be used as the crystallization induced metal layer 30 is a metal that, reacts with amorphous silicon and induces crystallization of the amorphous silicon, and is the same as a material that may be used in a MILC method. For example, the crystallization induced metal layer is any one selected from the group consisting of Ni, Pd, Ti, Ag, Au, Al, Sn, Sb, Cu, Co, Cr, Mo, Tr, Ru, Rh, Cd, and Pt.

Figure 19:
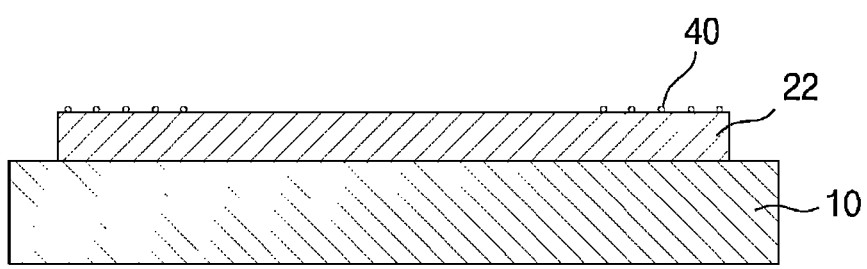

Subsequently, as shown in FIG. 19, the crystallization induced metal layer 30 that have been formed in the first and second regions 51a and 51b is removed. In other words, when die crystallization induced metal layer 30 that was deposited on a portion of the upper side of the active region 22 is removed, dot-shaped metal silicide seeds 40 remain on the surfaces of the first and second 51a and 51b regions, with a constant density.

A method of removing the crystallization induced metal layer 30 may be carried out in the same manner as that of the first embodiment of the present invention.

As described above, when the crystallization induced metal layer 30 is removed, a crystallization induced metal is combined with a silicon atom to thus leave dot-shaped metal silicides to be unremoved since the dot-shaped metal silicides are strongly combined on the surface of the amorphous silicon during deposition of the crystallization induced metal by the sputtering process.

When the remaining dot-shaped metal silicides are heat-treated for crystallization, it acts as seeds for crystallizing amorphous silicon, that is, as nuclei for growth of grains, to thereby crystallize the amorphous silicon into polycrystalline silicon (poly-Si), and to thus achieve crystallization at a low temperatures lower than about 600° C.

In addition, the metal silicide seeds 40 are probabilistically combined with silicon due to the plasma energy and are formed in the form of dots, when the crystallization induced metal layer 30 is deposited by the sputtering method, to thereby obtain a polycrystalline silicon thin film in which uniformity of grains is improved.

As shown in FIG. 19, when the metal silicide seeds 40 are formed on the first and second regions 51a and 51b made of the amorphous silicon, by removing the crystallization induced metal layer 30 immediately after the crystallization induced metal layer 30 has been deposited, the active region 22 is heat-treated, for crystallization. Here, it is desirable that a heat-treatment process is performed in a furnace in a batch process manner, for example, at about 500° C. to about 600° C. for about 2 to about 6 hours.

Figure 20:
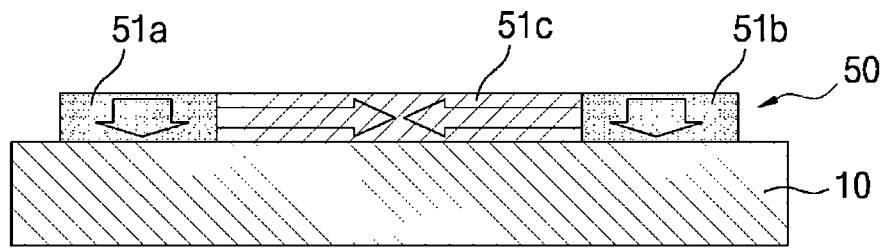

In this case, when the active region 22 is heat-treated, a crystalline growth is achieved in the first and second regions 51a and 51b where the metal silicide seeds 40 are disposed, in vertical and circumferential directions from each of the dot-shaped the metal silicide seeds 40 by the metal silicide seed induced crystallization (SIC) method, as illustrated in FIG. 20, to thus crystallize the amorphous silicon into the polycrystalline silicon.

In addition, a third region 51c is positioned between the first region 51a and a second region 51b in which the metal silicide seeds 40 are not formed in the third region 51c. The metal silicides move from the first region 51a and the second region 51b to the third region 51c, by the metal silicide seed induced lateral crystallization (SILC) method, to thus crystallize the amorphous silicon into the polycrystalline silicon. As a result, the amorphous silicon active region 22 is converted into a polycrystalline silicon active region 50 as a whole.

A method of manufacturing a thin film transistor using a polycrystalline silicon layer obtained by a crystallization method, using SIC/SILC processes in accordance with the present invention will be described below with reference to FIGS. 21 to 25.

Figure 21:
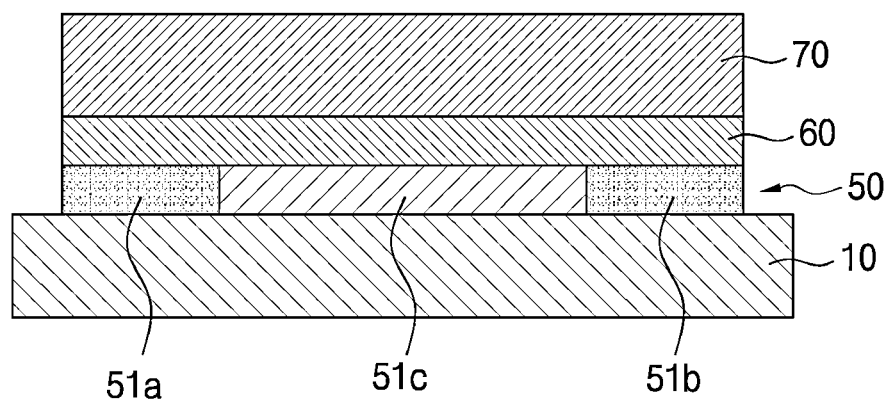

First, as shown in FIG. 21, an insulating layer 60 for forming a gate insulating layer is formed on the surface of an active region 50, and subsequently a metal layer 70 for forming a gate electrode is formed on the surface of the insulating layer 60. In FIG. 21, the insulating layer 60 and the metal layer 70 are formed in the upper portion of the substrate 10 as a whole, but they are illustrated only in the active region 50 for convenience of description.

Here, a silicon oxide ($SiO_2$) layer or a silicon nitride ($Si_3N_4$) layer may be used as the insulating layer 60, and a conductive material such as W, Pt, Ti, Al, Ni, and Mo may be used as the metal layer 70 for forming a gate electrode.

Figure 22:
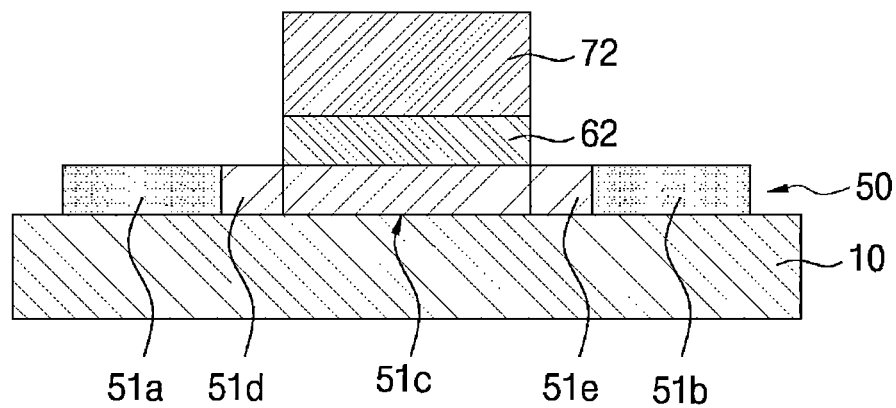

After the insulating layer 60 and the metal layer 70 have been deposited, as shown in FIG. 22, an etch mask (not shown) is formed with a photoresist on top of the insulating layer 60 and the metal layer 70, and then the metal layer 70 for forming a gate electrode and the insulating layer 60 for forming a gate insulating layer are sequentially etched to thus form a gate electrode 72 and a gate insulating layer 62.

In this case, it is desirable that the gate electrode 72 and the gate insulating layer 62 are formed only in a portion corresponding to a channel region 52c of the third region 51c, and offset portion 51d and 51e are formed to be exposed at both sides of the gate electrode 72 and the gate insulating layer 62.

Figure 23:
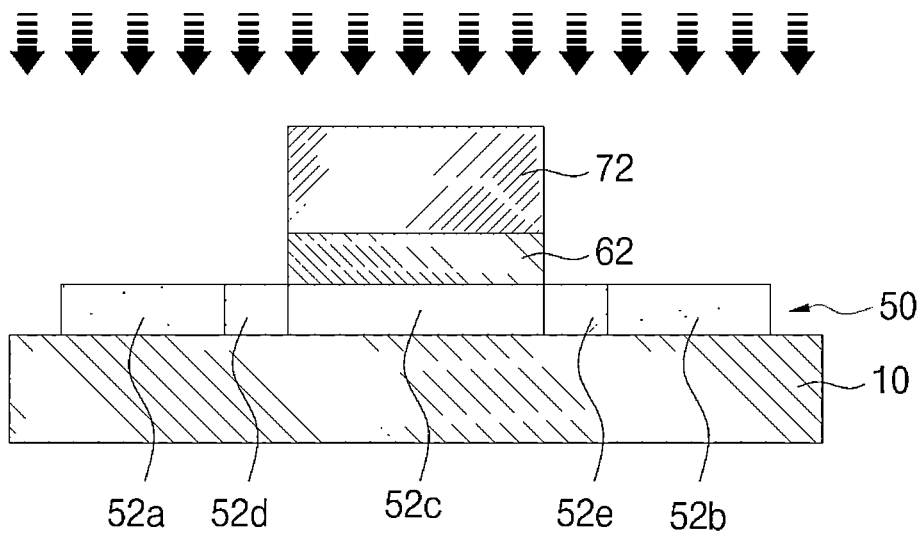

After that, as shown in FIG. 23, N-type or P-type dopant ions are ion-implanted into an active region 50 made of polycrystalline silicon crystallized by the SILC method, that is, the first and second regions 51a and 51b and the offset, portions 51d and 51e, by using the etch mask (not shown) as an ion-implantation mask, to thus define a source region 52a, a drain region 52b, and offset regions 52d and 52e.

Here, in the case of the NF type dopant ions, for example, P, $PH_3$, or As may be used as the N-type dopant, and in the case of the P-type dopant ions, for example, B, $B_2H_6$ or $BH_3$ may be used as the P-type dopant. As a result, a region that is positioned between the exposed source area 52a/offset region 52d and the exposed drain region 52b/offset region 52e and where no dopant is injected becomes a channel region 52c.

When doping for the source region 52a/offset region 52d and the drain region 52b/offset region 52e are completed, a substrate 10 is heat-treated under an atmosphere of hydrogen at a temperature of about 400° C. to about 600° C., for example, at 550° C. for about 1 hour to 5 hours, to thus activate the dopant injected into the source region 52a/offset region 52d and die drain region 52b/offset region 52e and to simultaneously remove a dangling bond to thereby reduce a leakage current of the manufactured thin film transistor.

Figure 24:
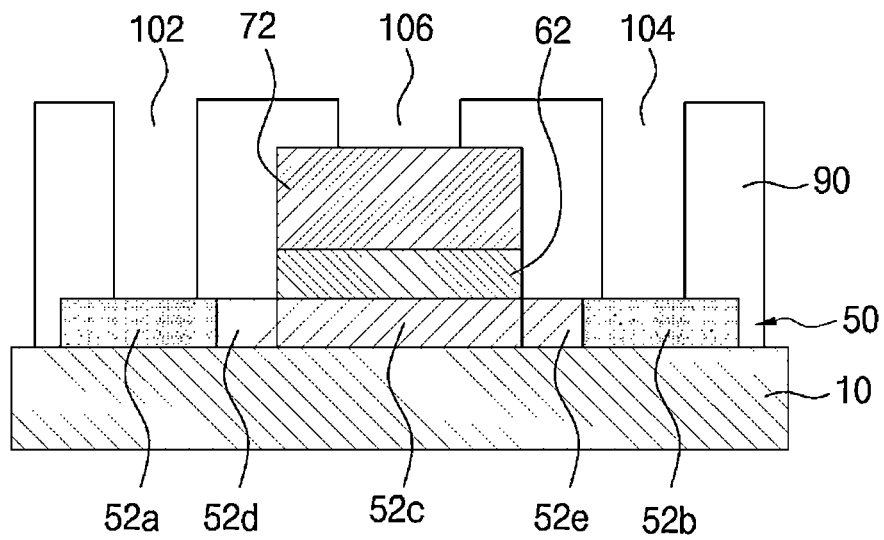
Figure 25:
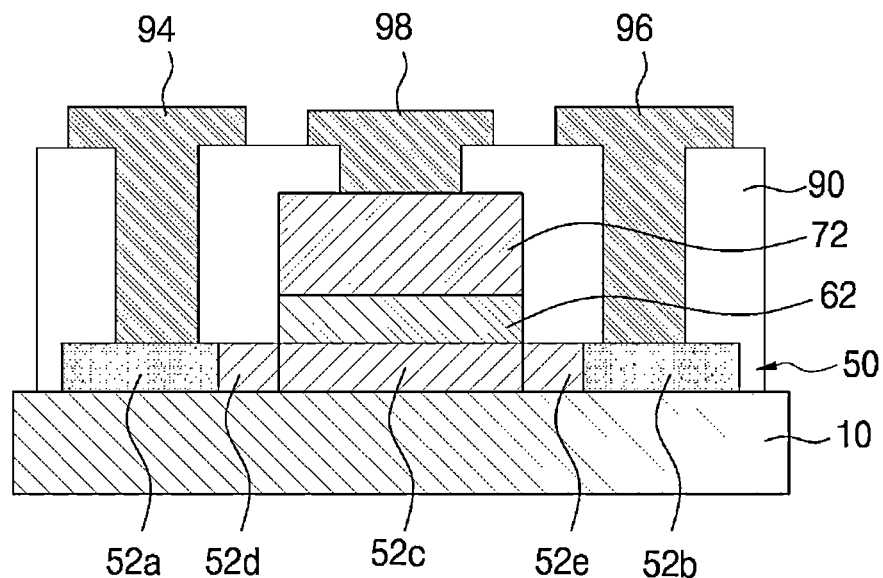

Finally, as shown in FIGS. 24 and 25, according to an existing process, an interlayer insulating layer 90 is formed on the substrate 10, and some portions of the interlayer insulating layer 90 are etched to thus form contact windows 102, 106, and 104 for the source region 52a, the drain region, 52b, and the gate electrode 72. Thereafter, a source electrode 94, a drain electrode 96, and a gate electrode 98 are formed by using a conductive material, to thereby complete a thin film transistor.

As described above, according to the present invention, an amorphous silicon thin film may be crystallized without metal contamination, to thus manufacture a polycrystalline thin film transistor having excellent characteristics, while source and drain regions 52a and 52b undergo a vertical crystal growth and a channel region 52c under a gate undergoes a lateral crystal growth by performing a heat-treatment process by using dot-shaped metal silicide seeds 40 as crystallisation heat-treatment nuclei during performing a crystallization heat-treatment process in which the dot-shaped metal silicide seeds 40 remain on the surface of amorphous silicon when a crystallization induced metal layer 50 is deposited on the amorphous silicon of the source and drain regions 52a and 52b and then the crystallization induced metal layer 30 is removed.

In addition, according to the present invention, a polycrystalline thin film transistor of excellent characteristics can be manufactured by conducting a silicide seed induced lateral crystallization (SILC) method while offsetting the crystallization induced metal layer 80 from the gate electrode 72 and forming the crystallization induced metal layer 30 only in some portions of the source and drain regions.

The present invention can prevent a continuous inflow of a crystallization induced metal deposited by a metal induced lateral crystallization (MILC) method during performing a crystallization heat-treatment process, to thus minimize metal contamination of a channel region 52c, and to thereby manufacture a thin film transistor of excellent electrical characteristics.

Moreover, in the case that a amorphous silicon thin film is crystallized by a crystallization method using a SILC process, according to the present invention, a metal contamination problem that is the biggest problem of the metal induced crystallization, can be minimized, to thereby manufacture a high-performance polycrystalline silicon thin film transistor having a reduced leakage current to be described later.

In the manufacturing of the thin film transistor using the SILC crystallization method according to the second embodiment, a crystallization process for amorphous silicon proceeds first, and then a gate electrode and a gate insulating layer are formed. However, in the present invention, it is also possible to conduct the SILC crystallization after the gate electrode and the gate insulating layer are formed on top of the active region made of amorphous silicon.

A third embodiment of the present invention will be described below with reference to FIGS. 26 to 28. When the third embodiment of the present invention will be described, the same processes as those of the second embodiment will be described by using the processes described in the second embodiment.

First as shown in FIG. 17, an amorphous silicon layer 20 is formed on a substrate 10, and patterned to form art active region 22.

Subsequently, as shown in FIGS. 21 and 22, an insulating layer and a metal layer are deposited on top of the substrate 10, and then the metal layer and the insulating layer are sequentially etched, to thus form a gate electrode 72 and a gate insulating layer 62.

Figure 26:
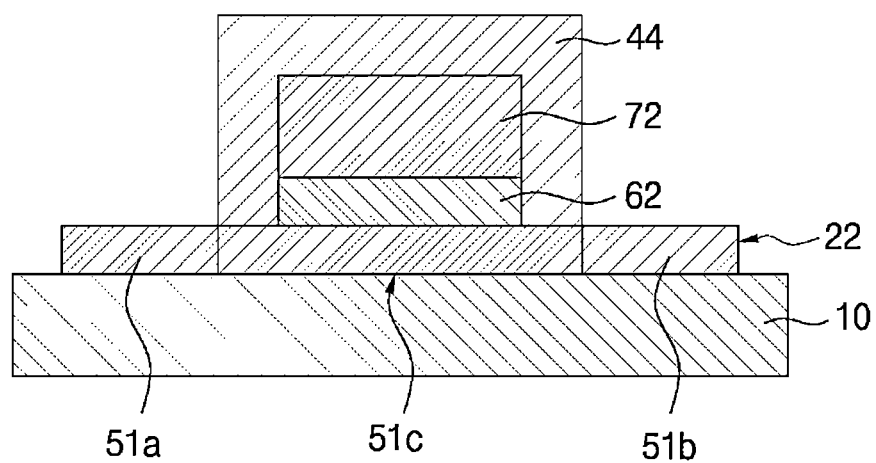
FIGS. 26 to 28 are cross-sectional views sequentially illustrating a process different from the first embodiment of the present invention, in a method of manufacturing a polycrystalline thin film transistor according to a third embodiment of the present invention.
Figure 27:
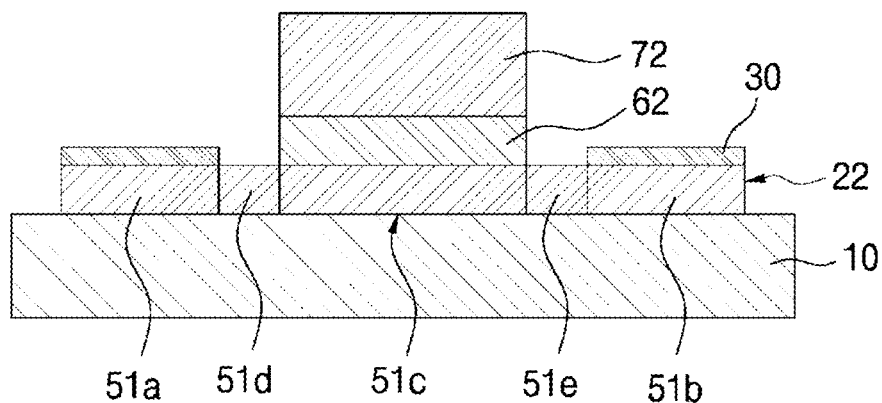

Thereafter, as shown in FIG. 26, a deposition blocking mask 44 is formed using a photoresist so as to cover the gate electrode 72 and the offset portions 51d and 51e. Here, a crystallization induced metal layer 30 is formed on the entire surface of the substrate 10 by the sputtering method, and then the deposition blocking mask 44 is removed. Then, as shown in FIG. 27, the crystallization induced metal layer 30 is patterned and formed only in the first and second regions 51a and 51b while excluding the third region 51c and the offset portions 51d and 51e of the active region 22.

Figure 28:
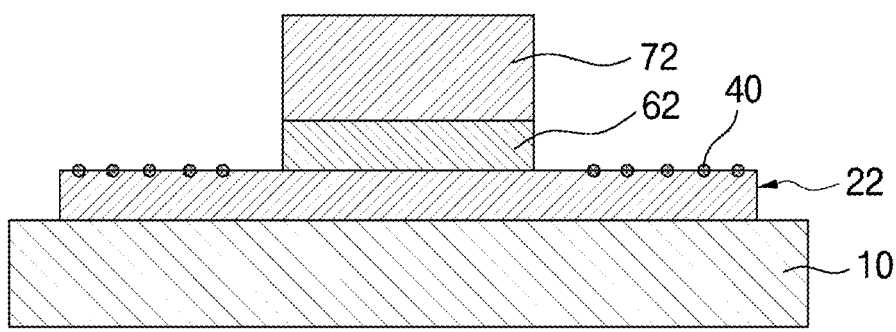

After that, when the crystallization induced metal layer 30 is removed, the metal silicide seeds 40 are formed only on the surface area of the source region 52a and the drain region 52b, as shown in FIG. 28.

Subsequently, when the active region 22 is heat-treated for crystallization, as shown in FIG. 20, a vertical crystalline growth is achieved in the first and second regions 51a and 51b where the metal silicide seeds 40 are placed, by the metal silicide seed induced crystallization (SIC) method, and crystallization takes place in the third region 51c where the metal silicide seeds 40 are not formed, by the metal silicide seed induced lateral crystallization (SILC) method, to thus convert, the entire amorphous silicon active region 22 into a polycrystalline silicon active region 50.

After that, as shown in FIGS. 23 to 25, N-type or P-type dopant ions are ion-implanted into an active region 50, to thus define a source region 52a, a drain region 52b, and offset regions 52d and 52e, and form a source electrode 94, a drain electrode 96, and a gate electrode 98 with respect to the source region 52a, the drain region 52b, and the gate electrode 72, respectively, to thereby complete a thin film transistor.

The polycrystalline silicon thin film transistor is manufactured by using the metal silicide seed induced lateral crystallization (SILC) method in accordance with the third embodiment similarly to the second embodiment, in which the amorphous silicon thin film may be crystallized without metal contamination, to thereby have an excellent characteristic of reducing a leakage current.

Example 2

According to the present invention, a polycrystalline thin film transistor is manufactured by using an offset silicide seed induced lateral crystallization (OS-SILC) method, and then characteristics of a polycrystalline silicon thin film and thin film transistor were measured. In addition, as a comparative example of the present invention, art amorphous silicon thin film is crystallized by using an offset metal induced lateral crystallization (OS-MILC) method, to thus manufacture a polycrystalline silicon thin film transistor by using the amorphous silicon thin film, and then characteristics of a polycrystalline silicon thin film and thin film transistor were measured.

First, in two cases of MILC and SILC to manufacture a thin film transistor, an amorphous silicon thin film of about 100 nm was deposited on a glass substrate (e.g., Corning eagle XG) for a flat panel display on which buffer oxide of about 300 nm was deposited using a $SiH_4$ gas at about 500° C. by a low pressure chemical vapor deposition (LPCVD) method.

Thereafter, after forming an active region by patterning an amorphous silicon thin film using a photolithography process, a native oxide layer formed on the surface of the amorphous silicon was removed by using an approximately 1% diluted HF solution, and nickel (Ni) was deposited only in the source and drain regions by using a lift-off method. Here, an additional mask was used to offset the channel region. For deposition of Ni, Ni of about 5 nm was deposited at the room temperature by a DC magnetron sputter method.

In order to remove the deposited nickel (Ni) before performing the crystallization heat-treatment process, the glass substrate was soaked in a sulfuric acid ($H_2SO_4$) solution for about 30 min at about 100° C., in the case of the SILC process. However, in the case of the MILC process, Ni was maintained unremoved. When the glass substrate was soaked in a sulfuric acid ($H_2SO_4$) solution in the SILC process, the sulfuric acid ($H_2SO_4$) solution reacts with the surface of the amorphous silicon and thus the nickel (Ni) silicides that were undergone silicidation was not removed but the nickel that was not undergone silicidation was removed.

Figure 29A:
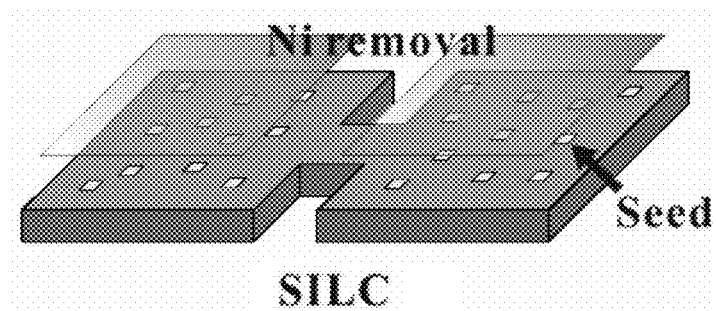
FIG. 29A is a photographical view illustrating a method of forming silicide seeds for a silicide seed induced lateral crystallization (SILC) method according to the present invention.
Figure 29B:
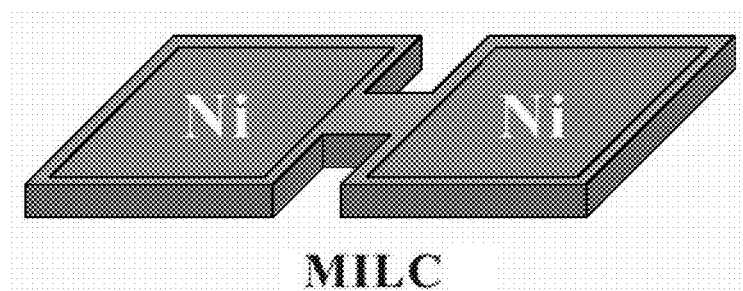
FIG. 29B is a photographical view illustrating an appearance after deposition of a crystallization induced metal layer according to the conventional metal induced lateral crystallization (MILC) method.

FIG. 29A is a photographical view illustrating a method of forming silicide seeds for a silicide seed induced lateral crystallization (SILC) method according to the present invention. FIG. 29B is a photographical view illustrating an appearance after deposition of a crystallization induced metal layer according to the conventional metal induced lateral crystallization (MILC) method.

Thereafter, heat-treatment was conducted for about 2 hours in a furnace at about 550° C. for crystallization in two cases.

Then, an identical process was carried out in order to manufacture TFTs for the example 2 and the comparative example. A silicon oxide layer of about 100 nm thick for use as a gate insulating layer was deposited using a $SiH_4$ and $N_2O$ gas at about 350° C. by using a plasma enhanced chemical vapor deposition (PECVD) method, and a molybdenum tungsten (MoW) layer of about 200 nm thick was deposited for use as a gate electrode by using a sputtering method. Then, the silicon oxide layer and the molybdenum tungsten (MoW) layer were sequentially patterned by a photolithography process, thereby forming a gate electrode and a gate insulating layer.

After deposition, the photolithography process was done for performing a patterning process for forming a gate electrode and a gate insulating layer, in which an etchant of $H_3PO_4+CH_3COOH+HNO_3+H_2O$ was used for etching of the molybdenum tungsten (MoW) layer, and the silicon oxide layer was etched by the RIE method using a $CHF_4$, Ar, or $SF_6$ gas.

Impurities of $B_2H_6$ were injected with the intensity of RF 150 W and DC 17 keV through an IMD (Ion mass doping) device in order to form source/drain regions, and a protective layer was deposited on the entire specimen by using an insulator ($SiO_2$). Thereafter, the entire specimen was heat-treated for about one hour at about 550° C., to thus activate the impurities, and contact windows were made in the gate, source and drain for being in contact with electrodes, to then carry out a metal wiring process called metallization.

This whole process was carried out in a clean room of 1000-Class, and a Keythley 2636 system was used for measurement of electrical characteristics.

Figure 30:
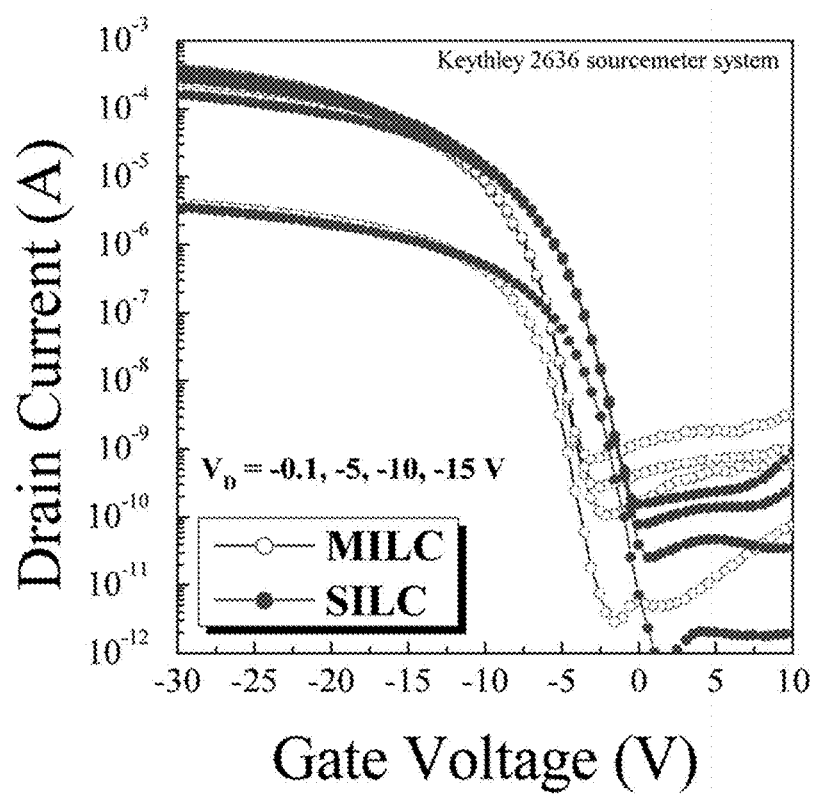
FIG. 30 is a graphical view showing a comparison result between a current-voltage transfer curve of a SILC polycrystalline silicon TFT according to the present invention and that of a conventional MILC polycrystalline silicon TFT.

In addition, FIG. 30 shows current-voltage transfer curves to mutually compare the characteristics of the polycrystalline silicon thin film transistor using the OS-SILC method, according to the present invention with the polycrystalline silicon thin film transistor using the conventional OS-MILC method.

FIG. 30 shows a current-voltage transfer curve of the OS-SILC polycrystalline silicon TFT (●) and that of OS-MILC polycrystalline silicon TFT (○) when the drain voltage ($V_D$) is about −0.1, about −5, about −10, and about −15V.

Ni formed on the active region with an offset from the gate insulating layer was removed after crystallization heat-treatment at the time of the production of the polycrystalline silicon thin film transistor using OS-MILC.

Electrical characteristics of p-channel polycrystalline silicon thin film transistors that were manufactured by using OS-MILC (comparative example) and OS-SILC (example 2), are illustrated in Table 3.

TABLE 3

| Key parameters of polycrystalline silicon TFTs | | |
|---|---|---|
| Key parameters | OS-SILC | OS-MILC |
| Field-effect mobility $p_{FE}(cm^2/V\text{-}s)$ | 63.2 | 66 |
| Threshold voltage $V_{th}(V)$ | 5.5 | 7.5 |
| Subthreshold slope S.S(V/dec) | 0.8 | 0.9 |
| Minimum leakage current $I_{Leak}(\times 10^{-10} A)$ | 0.8 | 2.7 |
| Drain, current @$V_G = 0$ V $I_D(\times 10^{-10} A)$ | 0.8 | 4.1 |
| Maximum on current $I_{ON}(\times 10^{-4} A)$ | 2.8 | 2.7 |
| Pinning current @$V_G = 15$ V $I_{Pinning}(\times 10^{-8} A)$ | 0.78 | 0.70 |

As shown in Table 3, when electrical characteristics of the OS-MILC polycrystalline silicon TFT are compared with those of the OS-SILC polycrystalline silicon TFT, a field-effect mobility, a subthreshold slope, a maximum on current, and a pinning current showed similar characteristics to each other.

However, a minimum leakage current was about 2.7 ($\times 10^{-10}$ A) in the case of the OS-MILC method, but it can be seen that the minimum leakage current became remarkably small as a bout 0.8 ($\times 10^{-10}$ A) in the case of the OS-SILC method.

Since the leakage current is very high in the case of using the OS-MILC method, it is impossible to apply the OS-MILC polycrystalline silicon TFTs to AMOLED devices. However, since the leakage current is reduced by one order in comparison with the conventional OS-MILC method in the case of using the OS-MILC method, it is possible to apply the OS-SILC polycrystalline silicon TFTs to AMOLED devices.

Referring to the current-voltage transfer curves shown in FIG. 30, the SILC polycrystalline silicon TFT (●) according to the present invention significantly reduces a threshold voltage together with a decrease in a leakage current, when compared with the MILC polycrystalline silicon TFT (○).

in general, when a crystallization induced metal such as Ni is trapped in a channel region, the trap metal serves as an N-type dopant. Accordingly, a threshold voltage is shifted to increase. However, in the present invention, as shown in FIG. 30, the threshold voltage is not shifted and thus the minimum leakage current is positioned at a point where $V_G=0V$. From this, it can be seen that the absolute value of the threshold voltage of SILC is smaller than that of MILC.

Figure 31:
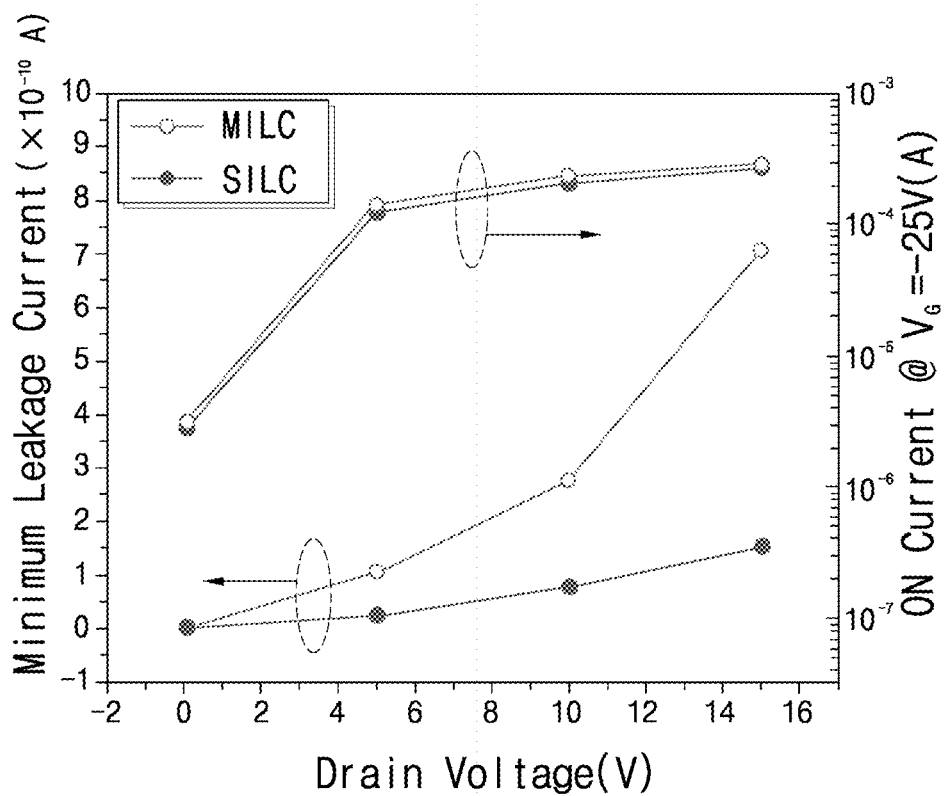
FIG. 31 is a graphical view showing a comparison result of an on-state current and a leakage current depending on a drain voltage between a SILC polycrystalline silicon thin film transistor (TFT) according to the present invention and a conventional MILC polycrystalline silicon TFT.

FIG. 31 is a graphical view showing a comparison result of an on-state current and a leakage current depending on a drain voltage between a SILC polycrystalline silicon thin film transistor (TFT) according to the present invention and a conventional MILC polycrystalline silicon TFT. As a drain voltage increases, an on-state current is constant, but it can be seen that a leakage current sharply increases in case of MILC and the leakage current is maintained low in case of SILC.

In other words, in the case of the SILC polycrystalline silicon TFT according to the present invention, uniformity of electrical characteristics is maintained as shown in FIG. 31. However, since a lot of the crystallization induced metals are trapped in the channel region in case of MILC, uniformity of electrical characteristics is not maintained.

in the MILC process where a crystallization induced metal such as Ni is trapped in the polycrystalline silicon, a trap state is formed within a silicon band gap to thus cause a leakage current. As the drain voltage gets high, a leakage current occurs from the trap state that is formed deeply in the band gap.

However, in the SILC process according to the present invention, unlike the MILC process, a relatively small number of trap states are formed within the band gap. Accordingly, even if a high electric field is applied because the drain voltage rises, a low leakage current is maintained.

This means that there are many defects that induced the leakage current in the channel region in the case of the MILC process, that is, means that there are a lot of the trapped metal silicides. To support this, a trap state density (Nt) was confirmed through the Levinson plot method.

Figure 32:
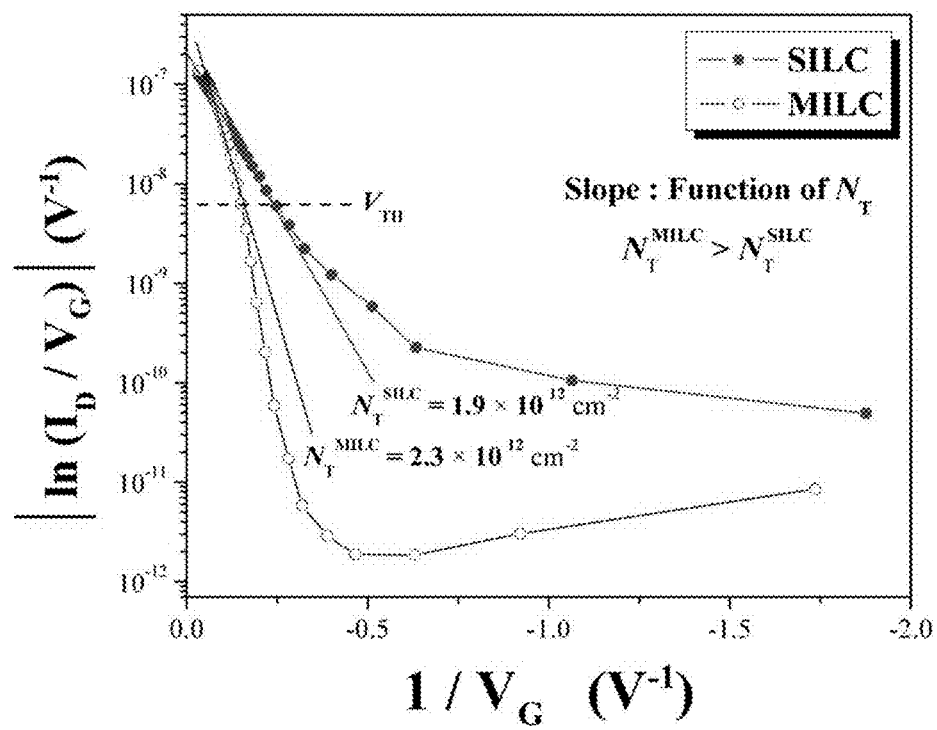
FIG. 32 is a graphical view showing a result of quantitatively analyzing trap state densities in a channel region of MILC and SILC polycrystalline silicon thin film transistors using the Levinson plot.

FIG. 32 is a graphical view showing a result of quantitatively analyzing trap state densities in a channel region of MILC and SILC polycrystalline silicon thin film transistors using the Levinson plot.

The polycrystalline silicon has many trap states in the grain boundaries. It has been reported that these trap states trap charge carriers and build a potential barrier, to thus allow a low carrier.

Additional scattering and presence of the potential barrier at the grain boundaries induces a field effect mobility to degrade. When a high density of the trap states are formed, a threshold voltage, a subthreshold slope, and an off-state leakage current increase.

In the case of crystallization using the SILC method, the trap state density ($Nt^{SILC}$) is about $1.9 \times 10^{12}$ cm$^{-2}$, and in the case of crystallization using the MILC method, the trap state density ($Nt^{SILC}$) is about $2.3 \times 10^{12}$ cm$^{-2}$. In the case of crystallization using the SILC method, it can be seen that the number of trap states has significantly decreased in comparison with the MILC process. The decrease of the trap state density means that defects were effectively terminated by silicide seeds.

The SILC crystallization method uses a silicide seed catalyst, and reduces formation of grain boundaries and Ni contamination, to thereby reduce the defects.

Figure 33:
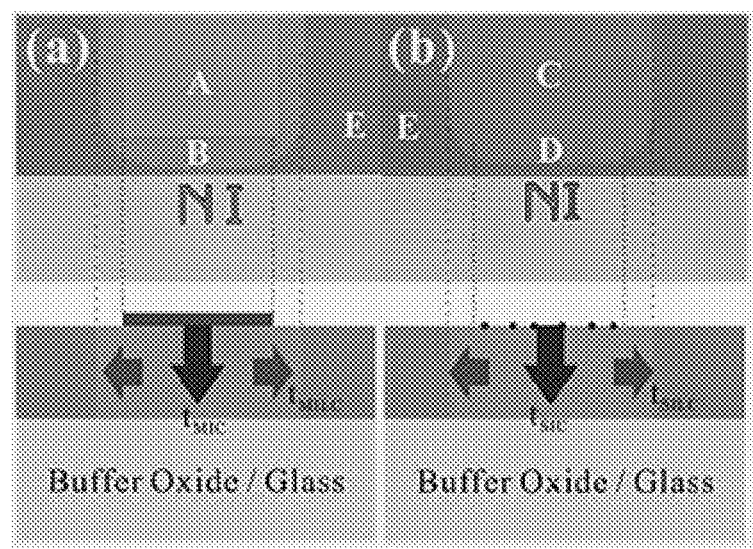
FIG. 33 shows a micrograph and a schematic diagram showing a crystallization process after performing MIC/MILC processes in a left-hand side (a) and a micrograph, and a schematic diagram showing a crystallization process after performing SIC/SILC processes in a right-hand side (b).

FIG. 33 shows a micrograph and a schematic diagram showing a crystallization process after performing MIC/MILC processes in a left-hand side (a) and a micrograph and a schematic diagram showing a crystallization process after performing SIC/SILC processes in a right-hand side (b). By the MIC and MILC micrographic portions shown in the left-hand side (a) of FIG. 33, it can be seen that a zone A and a zone B represent the MIC and MILC micrographic portions, respectively, and the MIC and MILC micrographic portions are represented as two different colors. A microscope used in the experiment is equipped with a Nomarski filter. A difference between colors observed through the filter represents a difference between crystals. As a result, there is a big difference between MIC and MILC crystallization patterns, and it can be seen that this difference is concentration of Ni contamination. Meanwhile, in the case of the SIC/SILC processes shown in right-hand side (b) of FIG. 33, there is no difference between the two zones A and B. This means that crystals grown in the SIC process proceed to the SILC process.

Figure 34A:
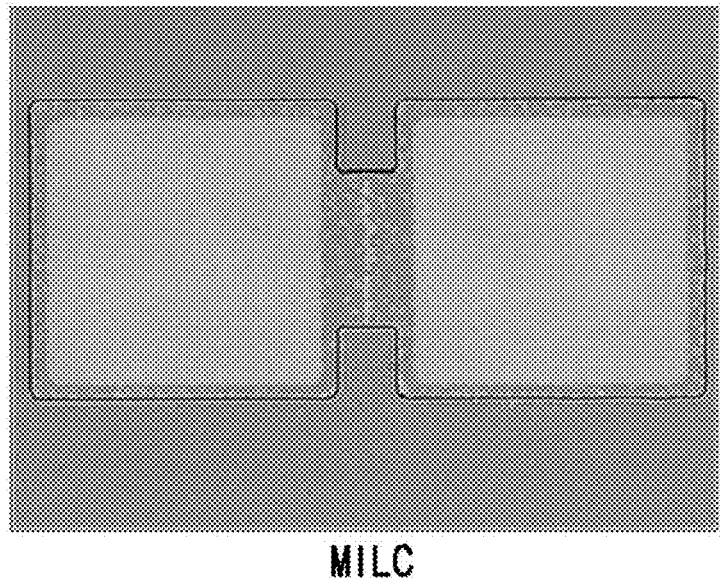
FIG. 34A is a micrographic view showing an appearance after performing a MILC crystallization process and then depositing amorphous silicon thereon in order to learn a content and location of Ni silicides.
Figure 34B:
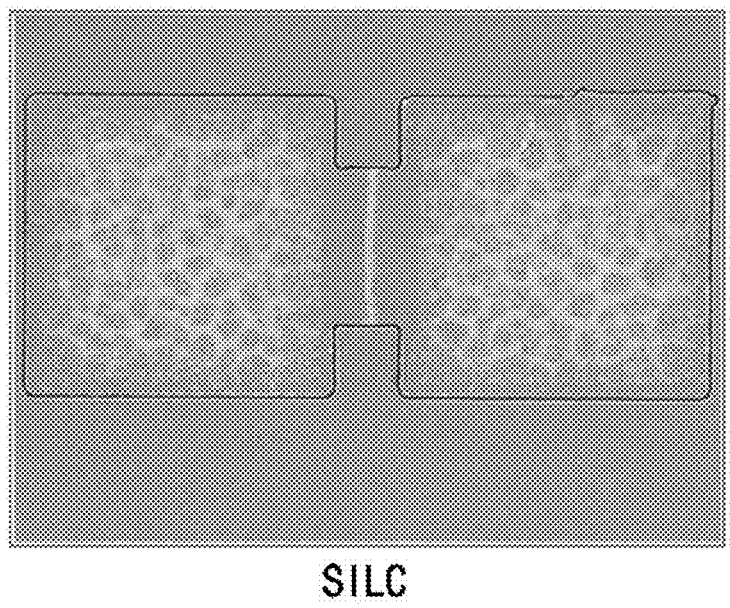
FIG. 34B is a micrographic view showing an appearance after performing a SILC crystallization process and then depositing amorphous silicon thereon in order to learn a content and location of Ni silicides.

FIG. 34A is a micrographic view showing an appearance after performing a MILC crystallization process and then depositing amorphous silicon thereon, and FIG. 34B is a micrographic view showing an appearance after performing a SILC crystallization process and then depositing amorphous silicon thereon. These methods show portions that have been crystallized due to movement of Ni silicides, to thus accurately see a content and location of the Ni silicides.

In the SILC process, it can be seen that seeds existed in the form of dots during deposition and removal of Ni, when considering that a SIC area was not continuously crystallized. Meanwhile, in the MILC process, it can be seen that a lot of Ni was trapped when considering that a MIC area was entirely crystallized.

In addition, in both cases of SILC and MILC, many Ni silicide traps were created at portions where the Ni silicides were laterally grown and contacted the other adjacent laterally grown Ni silicides. However, it can be seen that no silicides exist in the laterally grown area in case of SILC, but a lot of Ni silicides exist therein in case of MILC.

Figure 35:
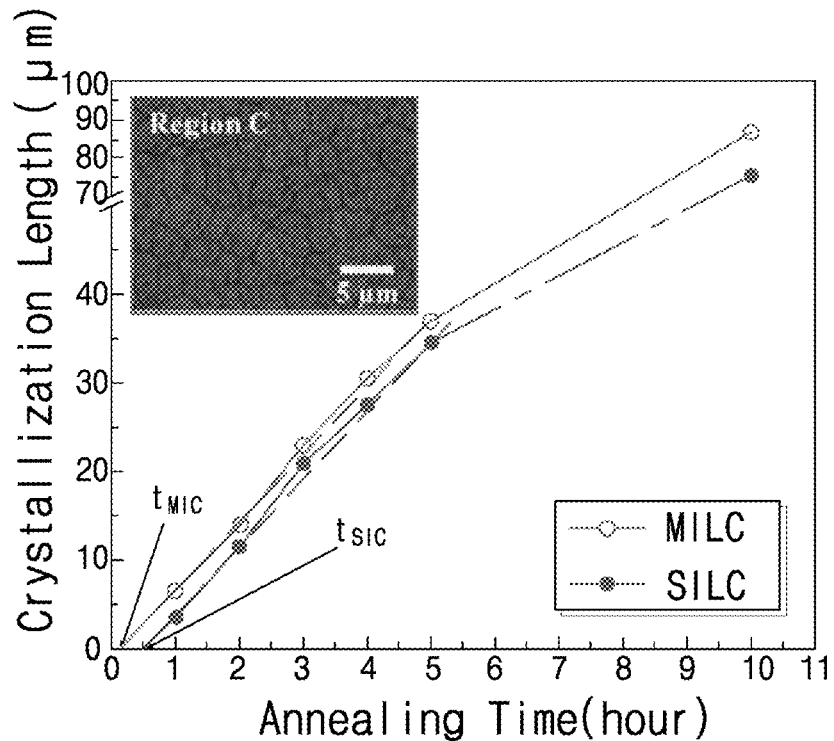
FIG. 35 is a graphical view showing lengths of growth depending on a crystallization time according to MILC and SILC methods.

FIG. 35 is a graphical view showing lengths of growth depending on a crystallization time according to MILC and SILC methods. Since growth rates of the two crystallization methods are same but points in time of starting initial growths differ, it can be seen that SILC needs a more heat-treatment time of approximately 30 minutes than MILC, in order to obtain the same length of growth.

Referring to a photo of an area C in FIG. 35, it can be seen that seeds are located at the center of each grain.

Figure 36A:
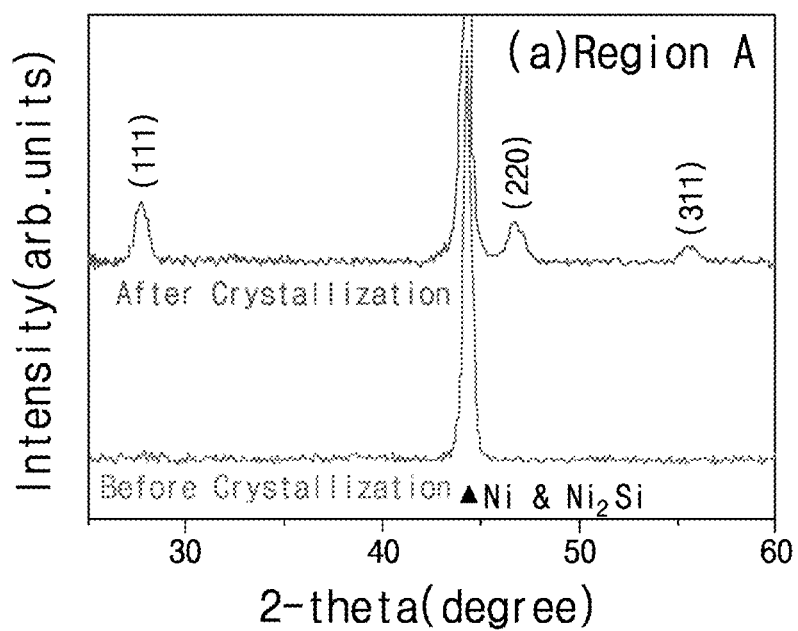
FIGS. 36A and 36B are graphical views illustrating XRD (X-ray diffraction) analysis results of MIC and SIC areas, respectively.
Figure 36B:
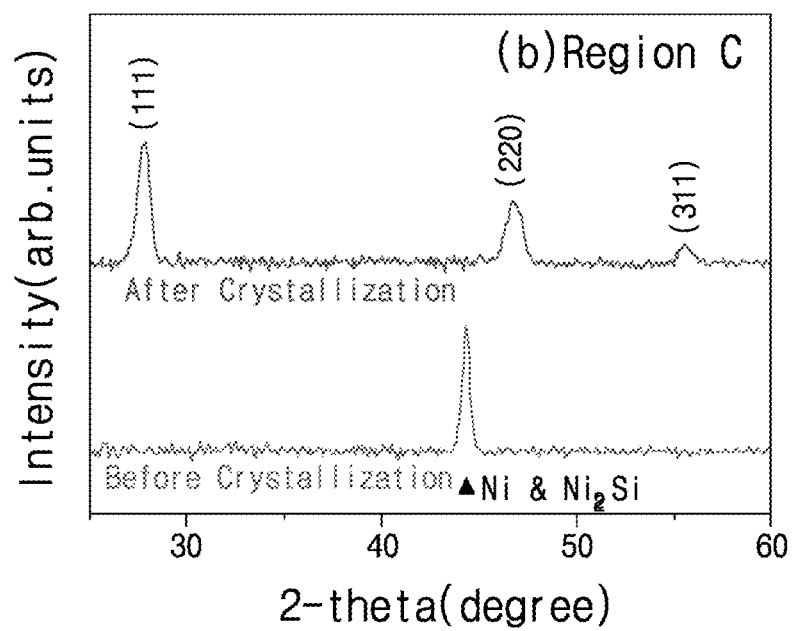

FIGS. 36A and 36B are graphical views illustrating XRD (X-ray diffraction) analysis results of MIC and SIC areas, respectively. In both cases, it can be seen that there exist many (111), (220), and (311) planes. However, in case of MIC, it can be seen that a peak of Ni exists significantly even after the MIC crystallization. Meanwhile, in case of SIC, it can be seen that the Ni peak that existed before crystallization disappeared and (111), (220), and (311) planes were created dominantly. As described above, since SILC performs a grain growth as an extension of SIC, the SILC crystal planes may be identified by identification of the SIC crystal planes.

Figure 37A:
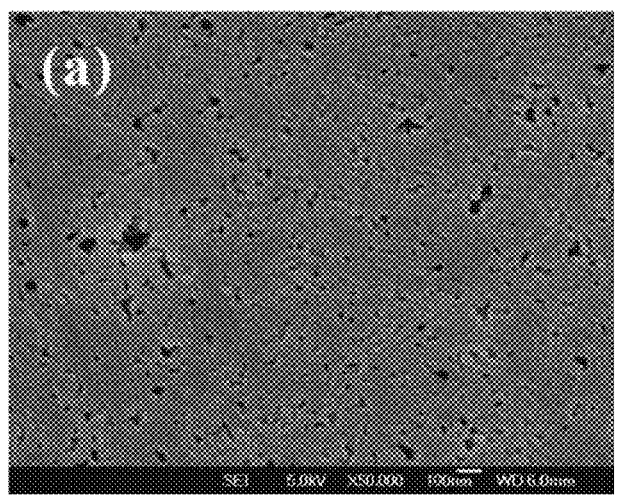
FIGS. 37A and 37B are photographical views showing FESEM (Field Emission Scanning Electron Microscopy) photos of MILC and SILC areas, respectively.
Figure 37B:
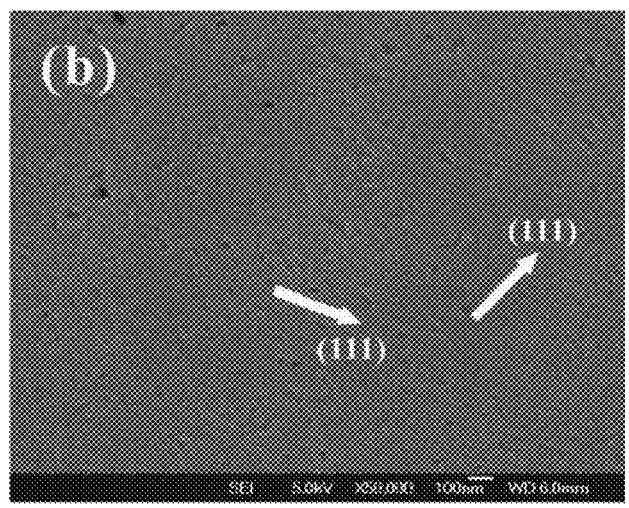

FIGS. 37A and 37B are photographical views showing FESEM (Field Emission Scanning Electron Microscopy) photos of MILC and SILC areas, respectively. For the FESEM observation, crystallized polycrystalline silicon samples were Secco-etched. A Secco etchant may selectively etch the Ni silicides trapped with the amorphous silicon from the crystalline silicon (Si).

In the case of MILC shown in FIG. 37A, it can be seen that many holes were caused by removal of Ni silicides that have been trapped by collision of needle-shaped grains during Secco-etching. In the case of SILC shown in FIG. 37B, it can be seen that holes did not nearly exist. This means that the number of Ni silicide traps during the lateral growth in the case of SILC are less, and a crystal growth direction is constant, when compared with the MILC case.

In addition, since the SILC process starts with a lower concentration of Ni silicides at a leading end of the lateral growth than the MILC process do, SILC has longer particles than MILC. As a result, SILC has fewer grain boundaries compared to MILC. The grain boundaries trap the charge carriers and build a potential barrier with respect to a flow of the carriers. Therefore, SILC consisting of particles longer than MILC, has more excellent electrical characteristics than MILC.

Moreover, a crystalline fraction of SILC is about 96.69%, and is higher than that of MILC, that is, about 95.24%. SIC and MIC represent crystalline fractions of about 94.53% and about 82.54%, respectively. The MIC area represents the lowest crystalline fraction, which means that many Ni silicides were contained as defects.

Figure 38:
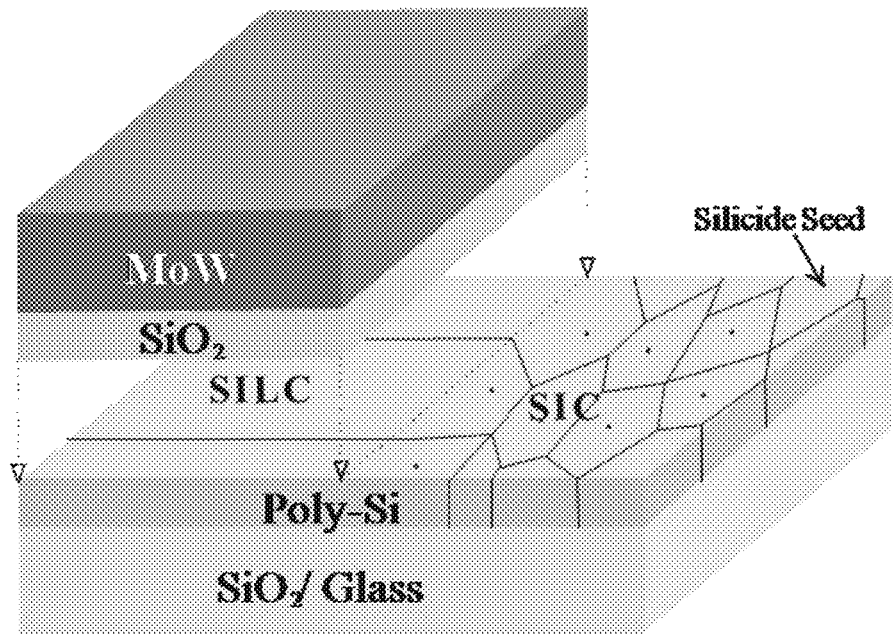
FIG. 38 is a schematic diagram showing crystal growths that are expected after polycrystalline silicon thin films whose source, drain, and channel regions have been crystallized by SIC and SILC methods according to the present invention is applied to a thin film device.

FIG. 38 is a schematic diagram showing crystal growths that are expected after polycrystalline silicon thin films whose source, drain, and channel regions have been crystallized by SIC and SILC methods according to the present invention is applied to a thin film device.

In the present invention, as shown in FIG. 38, lateral crystallisation is not achieved from a crystallization induced metal that is continuously deposited by the conventional metal induced lateral crystallisation (MILC) method. According to the present invention, dot-shaped metal silicides produced during sputtering by SIC act as crystallization induced nuclei, in the source/drain regions, to thus achieve crystal growths. Meanwhile, according to the present invention, in the channel region where dot-shaped metal silicide seeds are not produced, crystal growths are achieved along an extension line parallel to the silicides produced in the source/drain regions by SILC.

In other words, when the crystallization heat-treatment process is performed, crystal growths are achieved in the channel region positioned between the source region and the drain region, along an extension line parallel to the a small number of metal silicide grains produced in the source/drain regions. Accordingly, the SILC process forms grains of a very long needle-like form, in comparison with the MILC process that crystallizes as a continuous crystallization induced metal.

As a result, as shown in FIG. 38, the source and drain depletion regions are located in the inner side of the polycrystalline silicon crystallized in the lateral direction of the inner portion of the channel region from the silicide seeds. Therefore, the crystallization induced metal is not deposited directly at junctions between the source region and the channel region, and between the channel region and the drain region, to thereby obtain significantly improved electrical properties. In addition, a probability of being destroyed by the grain boundaries is reduced when electrons or holes move in the channel, to thereby obtain a high mobility.

In the case of the crystallization of the second and third embodiments according to the present invention, dot-shaped metal silicide seeds are formed in the active region with an offset from the gate insulating layer at the time of production of the polycrystalline silicon thin film transistor, and then crystallization proceeds using the dot-shaped metal silicide seeds as the crystallization heat-treatment nuclei. However, it is possible to perform a crystallization process with no offset.

In other words, when polycrystalline thin film transistors are manufactured by using the self-aligned metal silicide seed induced lateral crystallization (SA-SILC) method, a crystallization induced metal is deposited in source and drain regions in a self-aligned manner, by using a gate electrode as a mask, and then the deposited crystallization induced metal is immediately removed, to thus form dot-shaped metal silicides that are used as crystallization induced seeds.

Subsequently, the source and drain regions are crystallized info polycrystalline silicon by vertical crystal growths by the metal silicide seed induced crystallization (SIC) method that performs a crystallization heat-treatment process by using metal silicides as crystallization induced seeds, and the channel region under a gate undergoes a lateral crystal growth by the metal silicide seed induced lateral crystallization (SILC) method, to thereby crystallize an amorphous silicon thin film without, metal contamination.

Figure 39:
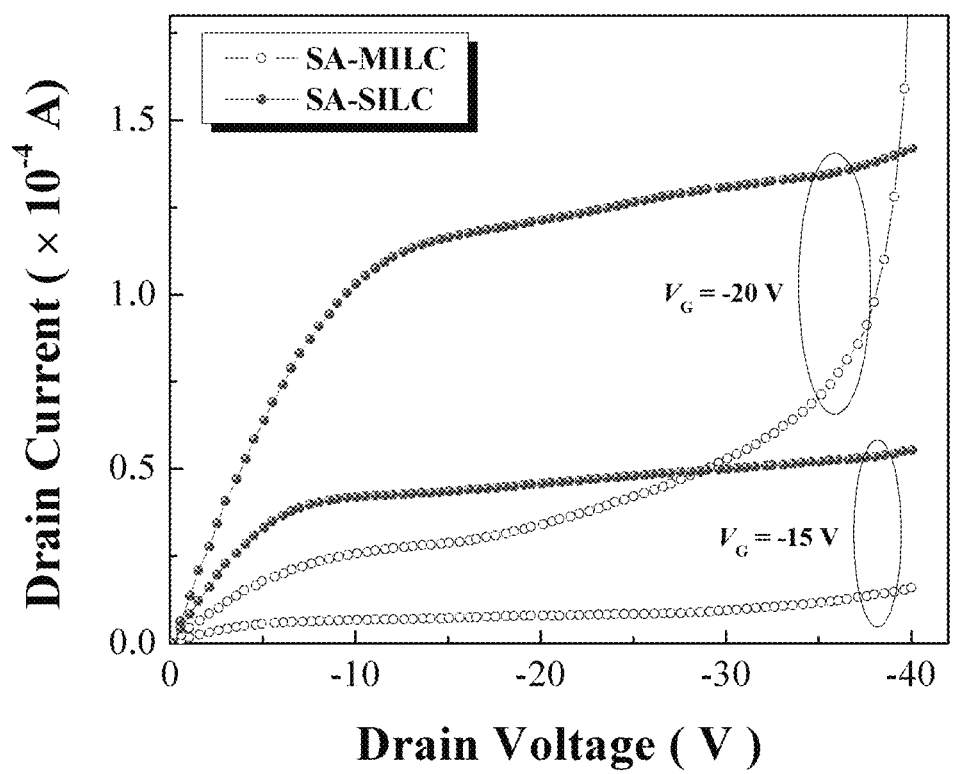
FIG. 39 is a graphical view showing a comparison result between saturation region characteristics of thin film transistors that are fabricated by using SA-MILC and SA-SILC crystallization processes, respectively.

FIG. 39 is a graphical view showing a comparison result between saturation region characteristics of thin film transistors that are fabricated by using SA-MILC and SA-SILC crystallization processes, respectively.

The SA-SILC polycrystalline silicon thin film transistor according to the present invention shows $I_D$-$V_D$ characteristics in which a drain current value is saturated in accordance with an increase of a drain voltage, differently from the conventional SA-MILC polycrystalline silicon thin film transistor. This is due to a fact that one of a drain electric field and an impact ionization rate is increased by presence of a charged defect state such as traps of grain boundaries or Ni contamination in the MIC/MILC grain boundaries when the MIC/MILC grain boundaries overlap drain junctions.

The SA-SILC polycrystalline silicon thin film transistor according to the present invention, may significantly improve characteristics of a field-effect mobility, a threshold voltage, a subthreshold slope, an on-state current, and an off-state current by using the SA-SILC crystallization method, in comparison with the conventional SA-MILC polycrystalline silicon thin film transistor.

In addition, when amorphous silicon is crystallized in a lateral direction of a channel region by silicide seeds from source and drain regions in the present invention, defects such as traps of grain boundaries including MIC/MILC grain boundaries and Ni contamination may be significantly reduced in a drain depletion region, when compared with the SA-MILC method.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof, but is defined by the claims to be described later and the technical spirit of the present invention.

What is claimed is:

1. A method of crystallizing an amorphous silicon thin film, the method comprising the steps of:
    forming an amorphous silicon layer on a substrate;
    forming a crystallization induced metal layer on the amorphous silicon layer;
    forming a number of dot-shaped metal silicide seeds on the amorphous silicon layer by removing the crystallization induced metal layer; and
    crystallizing the amorphous silicon layer by heat-treating the substrate by using the metal silicide seeds as crystallization seeds,
    wherein the method further comprises a step of forming an active region by patterning the amorphous silicon layer, wherein the crystallization induced metal layer is formed in both a source region and a drain region that are placed on both side ends of the active region, and then immediately removed.

2. The method of claim 1, wherein the crystallization induced metal layer is deposited by a sputtering method.

3. The method of claim 1, wherein the crystallization induced metal layer is formed to have a thickness of about 50 Å to about 100 Å.

4. The method of claim 1, wherein the crystallization induced metal layer is any one or an alloy of two or more selected from the group consisting of Ni, Pd, Ti, Ag, Au, Al, Sn, Sb, Cu, Co, Cr, Mo, Tr, Ru, Rh, Cd, and Pt.

5. The method of claim 1, wherein the crystallization induced metal layer is removed using sulfuric acid ($H_2SO_4$).

6. The method of claim 1, wherein the heat-treatment process is performed for 2 to 6 hours at a temperature of about 500° C. to about 600° C.

7. The method of claim 1, wherein the step of forming the crystallization induced metal layer in the source region and the drain region is performed by a lift-off method using a photoresist.

8. The method of claim 1, wherein the crystallization induced metal layer is formed with an offset area on both sides of a channel region to prevent the channel region disposed in the central area of an active region from being in contact with a crystallization induced metal.

9. A method of manufacturing a polycrystalline thin film transistor, the method comprising the steps of:
    forming an amorphous silicon layer on a substrate;
    forming an active region by patterning the amorphous silicon layer;
    forming a crystallization induced metal layer in both a source region and a drain region that are placed on both side ends of the active region;
    forming a number of dot-shaped metal silicide seeds on the surfaces of the source region and the drain region made of amorphous silicon by removing the crystallization induced metal layer;
    crystallizing the active region formed of the amorphous silicon layer by heat-treating the substrate by using the metal silicide seeds as crystallization seeds;
    sequentially forming an insulating layer and an electrode material on the upper portion of the active region to then pattern the sequentially formed insulating layer and electrode material, to thus sequentially form a gate electrode and a gate insulating layer; and
    ion-implanting N-type or P-type dopant ions in the exposed active region, to thus form the source region and the drain region.

10. The method of claim 9, wherein the crystallization induced metal layer is deposited by a sputtering method, and is formed to have a thickness of about 50 Å to about 100 Å.

11. The method of claim 9, wherein the crystallization induced metal layer is formed with an offset area on both sides of a channel region to prevent the channel region disposed in the central area of an active region from being in contact with a crystallization induced metal.

12. The method of claim 9, wherein the amorphous silicon that is provided in the source region and the drain region is crystallized into polycrystalline silicon by a vertical crystal growth using a metal silicide seed induced crystallization (SIC) method and the amorphous silicon that is provided in the remaining active region is crystallized into polycrystalline silicon by a lateral crystal growth using a metal silicide seed induced lateral crystallization (SILC) method, when crystallization is performed in the active region by using the metal silicide seeds as crystallization seeds.

13. A method of manufacturing a polycrystalline thin film transistor, the method comprising the steps of:

forming an amorphous silicon layer on a substrate;

forming an active region by patterning the amorphous silicon layer;

sequentially forming an insulating layer and an electrode material on the upper portion of the active region to then pattern the sequentially formed insulating layer and electrode material, to thus sequentially form a gate electrode and a gate insulating layer;

forming a deposition blocking mask that surrounds the gate electrode and the gate insulating layer on the upper surface of the substrate;

allowing a number of dot-shaped metal silicide seeds to remain in the source region and the drain region of the active region made of amorphous silicon by forming a crystallization induced metal layer on the substrate by using a sputtering method, and then immediately removing the crystallization induced metal layer;

heat-treating the substrate by using the metal silicide seeds as crystallization heat-treatment nuclei, thereby crystallizing the amorphous silicon that is provided in the source region and the drain region into polycrystalline silicon by a vertical crystal growth using a metal silicide seed induced crystallization (SIC) method and thereby crystallizing the amorphous silicon that is provided in the remaining active region into polycrystalline silicon by a lateral crystal growth using a metal silicide seed induced lateral crystallization (SILC) method; and ion-implanting N-type or P-type dopant ions in the exposed active region, to thus form the source region and the drain region.

14. The method of claim 13, wherein the deposition blocking mask is formed to cover the gate electrode and the gate insulating layer and an offset area of the active region, in a manner that the crystallization induced metal layer is offset from the gate insulating layer, and is formed in the source and drain regions.

15. The method of claim 14, wherein the offset area is set in a range of about 0.5 to about 1 μm.

16. A method of manufacturing a polycrystalline thin film transistor, the method comprising the steps of:

forming an amorphous silicon layer on a substrate;

forming an active region by patterning the amorphous silicon layer;

sequentially forming an insulating layer and an electrode material on the upper portion of the active region to then pattern the sequentially formed insulating layer and electrode material, to thus sequentially form a gate electrode and a gate insulating layer;

allowing a number of metal silicide seeds to remain in the active region made of amorphous silicon by forming a crystallization induced metal layer on the upper surface of the substrate by using a sputtering method, and then immediately removing the crystallization induced metal layer;

heat-treating the substrate by using the metal silicide seeds as crystallization heat-treatment nuclei, thereby crystallizing the amorphous silicon that is provided in the active region exposed to the outside of the gate insulating layer into polycrystalline silicon by a vertical crystal growth using a metal silicide seed induced crystallization (SIC) method and thereby crystallizing the amorphous silicon that is provided in the lower portion of the gate insulating layer into polycrystalline silicon by a lateral crystal growth using a metal silicide seed induced lateral crystallization (SILC) method; and ion-implanting N-type or P-type dopant ions in the active region of the polycrystalline silicon, to thus form a source region and a drain region.

17. The method of claim 16, further comprising a step of heat-treating the substrate for one to five hours at a temperature in the range of about 400° C. to about 600° C. under the hydrogen atmosphere, after having implanted dopants into the source region and the drain region.

18. The method of claim 16, wherein the channel region between the source region and the drain region undergoes a crystal growth along an extending line parallel to the metal silicides produced from the source region and the drain region, and source and drain depletion regions is position-set in the inside of the polycrystalline silicon that is crystallized from the silicide seeds toward a lateral direction of the inside of the channel region.

* * * * *